US008424176B2

(12) United States Patent
Smith et al.

(10) Patent No.: US 8,424,176 B2
(45) Date of Patent: Apr. 23, 2013

(54) METHODS OF FORMING TUNABLE CAPACITORS

(75) Inventors: Patrick Smith, San Jose, CA (US); Zhigang Wang, Sunnyvale, CA (US)

(73) Assignee: Kovio, Inc., San Jose, CA (US)

( * ) Notice: Subject to any disclaimer, the term of this patent is extended or adjusted under 35 U.S.C. 154(b) by 437 days.

(21) Appl. No.: 12/626,562

(22) Filed: Nov. 25, 2009

(65) Prior Publication Data

US 2010/0296225 A1 Nov. 25, 2010

Related U.S. Application Data

(60) Provisional application No. 61/117,836, filed on Nov. 25, 2008.

(51) Int. Cl.
*H01G 4/06* (2006.01)
(52) U.S. Cl.
USPC ............ 29/25.42; 29/25.41; 29/592.1; 29/600
(58) Field of Classification Search ...... 29/25.41–25.42, 29/600, 592.1–592.4; 343/700 MS, 572.1–572.5; 361/303, 306.3, 312
See application file for complete search history.

(56) References Cited

U.S. PATENT DOCUMENTS

| | | | |
|---|---|---|---|
| 3,886,415 A * | 5/1975 | Genthe | 361/314 |
| 4,038,167 A * | 7/1977 | Young | 204/192.15 |
| 4,063,229 A | 12/1977 | Welsh et al. | |
| 4,728,938 A | 3/1988 | Kaltner | |
| 5,081,445 A | 1/1992 | Gill et al. | |
| 5,119,285 A | 6/1992 | Liu et al. | |
| 5,218,189 A | 6/1993 | Hutchison | |
| 5,541,604 A | 7/1996 | Meier | |
| 5,608,379 A | 3/1997 | Narlow et al. | |
| 5,841,350 A | 11/1998 | Appalucci et al. | |
| 5,912,632 A | 6/1999 | Dieska et al. | |
| 6,233,817 B1 * | 5/2001 | Ellis et al. | 29/832 |
| 6,359,562 B2 | 3/2002 | Rubin | |
| 6,535,108 B1 | 3/2003 | Schrott et al. | |
| 6,547,148 B2 | 4/2003 | Kelly et al. | |
| 6,693,541 B2 | 2/2004 | Egbert | |
| 6,744,335 B2 | 6/2004 | Ryhänen et al. | |
| 6,951,621 B2 * | 10/2005 | Hanhikorpi | 216/13 |

(Continued)

OTHER PUBLICATIONS

International Preliminary Report on Patentability; International Application No. PCT/US2009/065998; May 31, 2011; 6 pages; The International Bureau of WIPO; Geneva, Switzerland.

(Continued)

*Primary Examiner* — Minh Trinh
(74) *Attorney, Agent, or Firm* — The Law Offices of Andrew D. Fortney; Andrew D. Fortney

(57) ABSTRACT

The present invention relates to methods of making and using tunable capacitors and devices. Using the methods described, one or more secondary tunable capacitors can be connected to a primary capacitor by printing a connector conducting layer or feature to obtain a desired net capacitance. Digitally printing the connector conducting layer allows the number of secondary capacitors connected into the circuit to be determined during the integrated circuit fabrication process, without the need for individual masks connecting the appropriate number of secondary capacitors. This provides an in-process or post-process trimming method to obtain the desired precision and accuracy for capacitors. Various sizes and combinations of secondary capacitors can be connected to obtain high precision capacitors and/or improved matching of capacitance values.

28 Claims, 15 Drawing Sheets

U.S. PATENT DOCUMENTS

| | | |
|---|---|---|
| 7,098,576 B2 | 8/2006 | Allison et al. |
| 7,135,782 B2 * | 11/2006 | Nishikawa .................. 257/796 |
| 7,152,804 B1 | 12/2006 | MacKenzie et al. |
| 7,286,053 B1 | 10/2007 | Gudeman et al. |
| 7,294,449 B1 | 11/2007 | Gudeman et al. |
| 7,314,513 B1 | 1/2008 | Zürcher et al. |
| 7,387,260 B1 | 6/2008 | MacKenzie et al. |
| 7,422,708 B2 | 9/2008 | Kunze et al. |
| 7,485,691 B1 | 2/2009 | Guo et al. |
| 7,491,782 B1 | 2/2009 | Guo et al. |
| 7,498,317 B2 | 3/2009 | Nagaoka et al. |
| 7,498,948 B1 | 3/2009 | Gudeman et al. |
| 7,531,011 B2 * | 5/2009 | Yamasaki .................. 29/25.03 |
| 7,553,545 B2 | 6/2009 | Kunze et al. |
| 2001/0040507 A1 | 11/2001 | Eckstein et al. |
| 2002/0163434 A1 | 11/2002 | Burke |
| 2005/0008880 A1 | 1/2005 | Kunze et al. |
| 2006/0211187 A1 | 9/2006 | Choi et al. |
| 2007/0007342 A1 | 1/2007 | Cleeves et al. |
| 2007/0273515 A1 | 11/2007 | MacKenzie et al. |
| 2008/0042212 A1 | 2/2008 | Kamath et al. |
| 2008/0044964 A1 | 2/2008 | Kamath et al. |
| 2008/0049375 A1 | 2/2008 | Lee |
| 2008/0088417 A1 | 4/2008 | Smith et al. |
| 2009/0004370 A1 | 1/2009 | Zurcher et al. |
| 2009/0020829 A1 | 1/2009 | Chandra et al. |
| 2009/0065776 A1 | 3/2009 | Scher et al. |
| 2009/0085095 A1 | 4/2009 | Kamath et al. |
| 2009/0109035 A1 | 4/2009 | Subramanian et al. |
| 2009/0137071 A1 | 5/2009 | Subramanian et al. |
| 2011/0260810 A1 * | 10/2011 | Quevy et al. .................. 333/200 |

OTHER PUBLICATIONS

PCT International Search Report and Written Opinion; International Patent Application No. PCT/US2009/065998; Dated Jan. 26, 2010; 7 pages; International Searching Authority/United States, Commissioner for Patents,.

Patrick Smith, Steven Molesa, Criswell Choi, Arvind Kamath and Vivek Subramanian; "Surveillance Devices with Multiple Capacitors"; U.S. Appl. No. 12/467,121; Filed May 15, 2009.

* cited by examiner

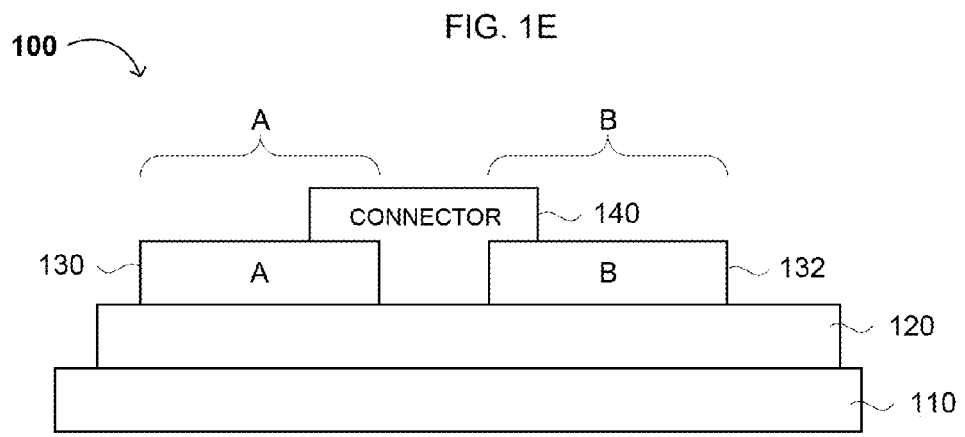
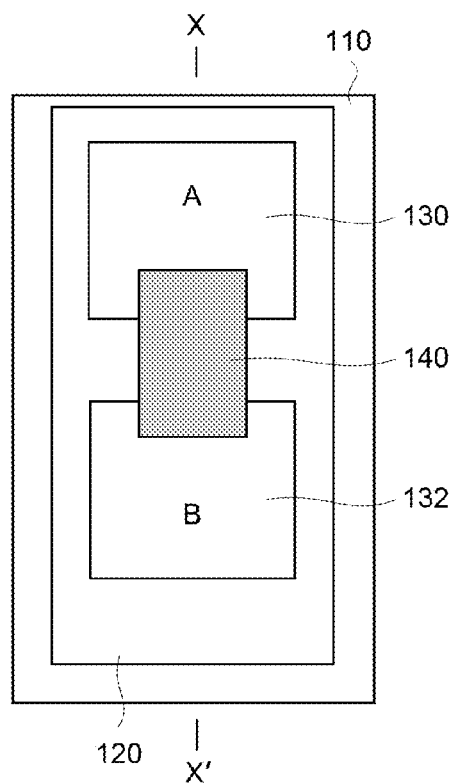 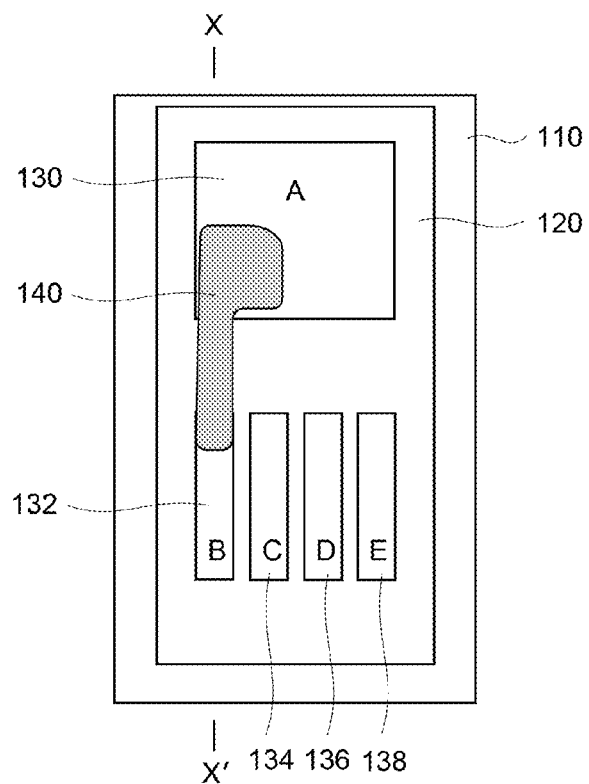

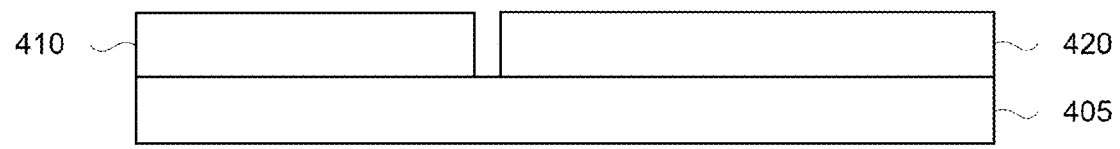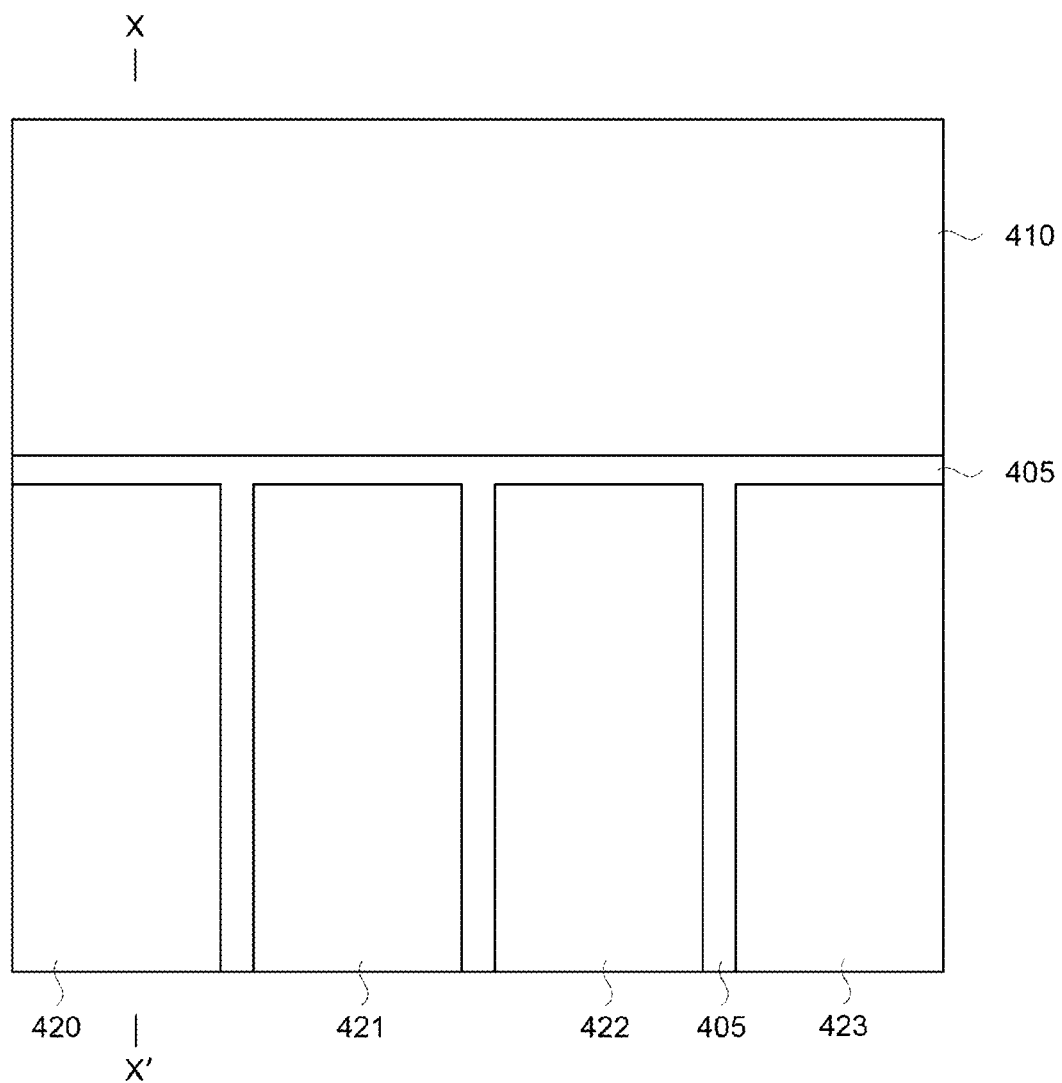

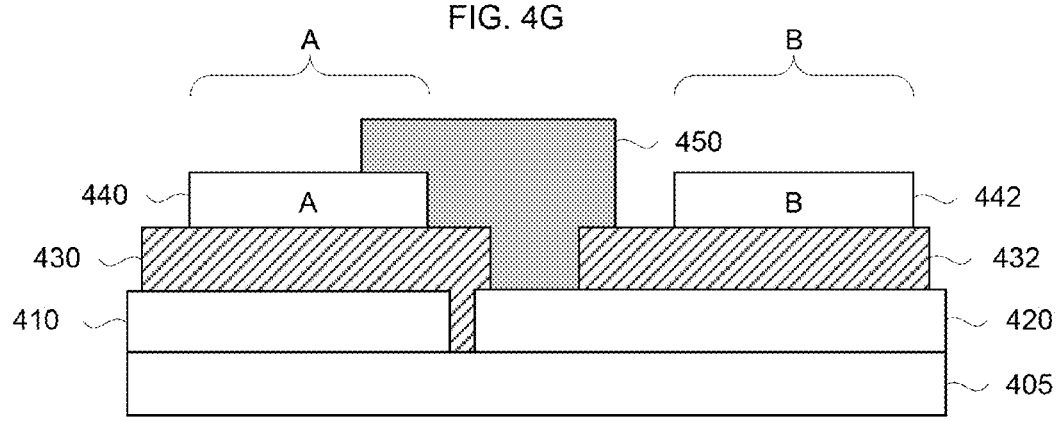
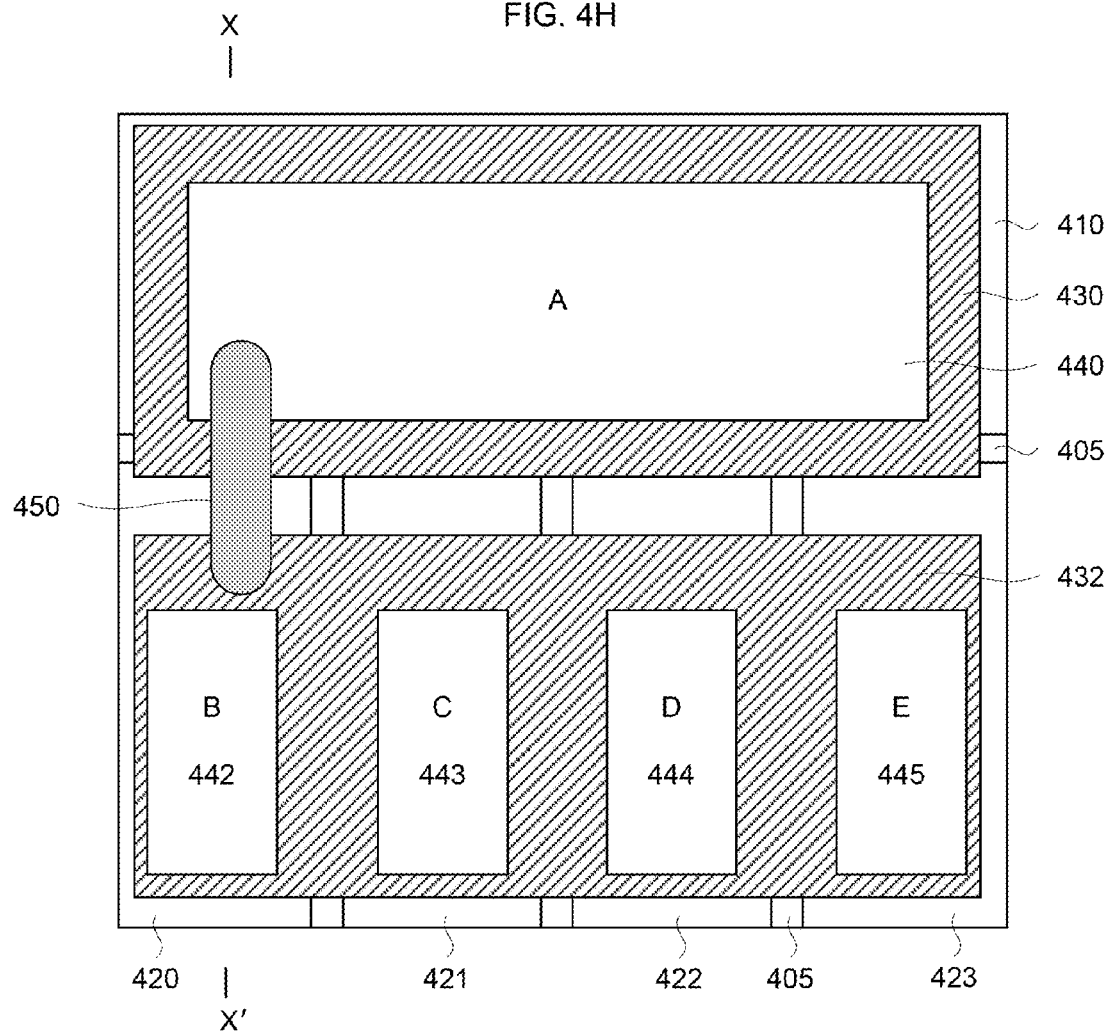

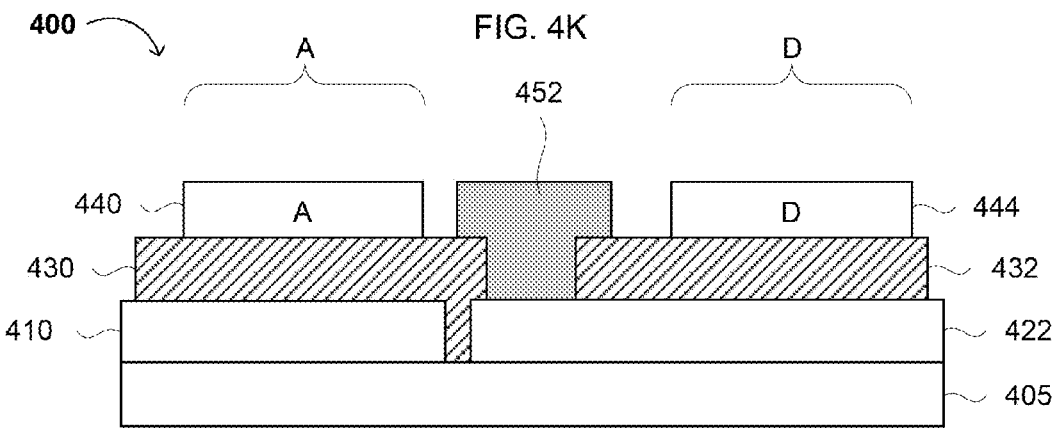
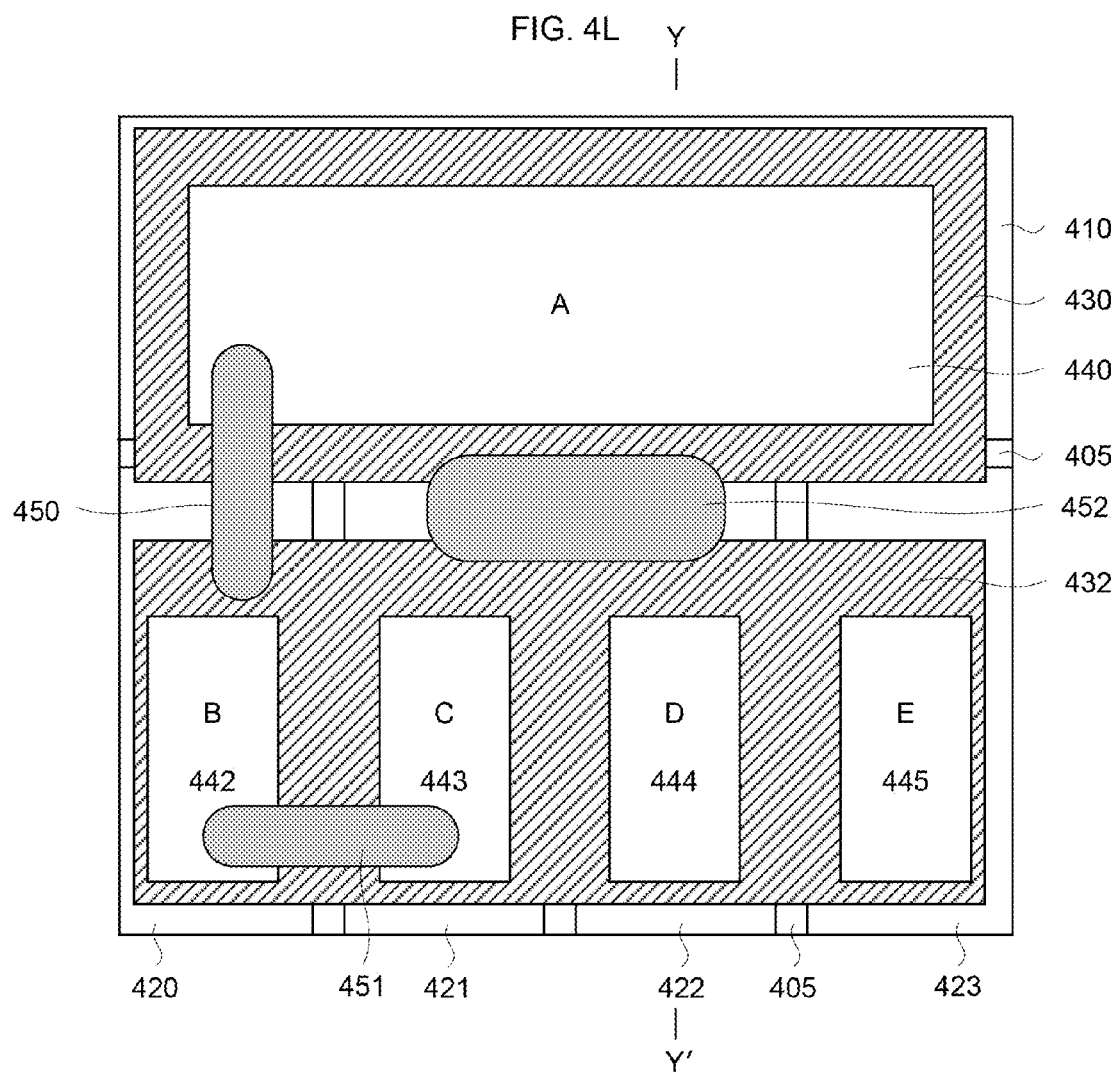

METHODS OF FORMING TUNABLE CAPACITORS

RELATED APPLICATIONS

This application claims the benefit of U.S. Provisional Application No. 61/117,836, filed on Nov. 25, 2008, which is incorporated herein by reference in its entirety.

FIELD OF THE INVENTION

The present invention generally relates to the field of integrated circuits and electronic devices. More specifically, embodiments of the present invention pertain to capacitors, methods of making capacitors, devices having capacitors, and methods of making and using such devices.

SUMMARY OF THE INVENTION

Embodiments of the present invention relate to tunable capacitors, methods of making tunable capacitors, devices having tunable capacitors, and methods of making and using such devices. Aspects of the present invention enable one or more tunable capacitors to be fabricated as part of a printed integrated circuit fabrication process. For example, a plurality of secondary (tuning) capacitors can be connected to a primary capacitor by printing a connector conducting layer (e.g., through digital printing processes) to obtain a predetermined and/or desired total capacitance. Printing (e.g., digitally) the connector conducting layer allows the number of secondary tuning capacitors connected into the circuit to be determined or selected part-way through the integrated circuit fabrication process, without the need for individual masks connecting the appropriate number of secondary capacitors. Embodiments of the present invention effectively provide an in-process or post-process trimming method to obtain the desired precision and accuracy for capacitors. Furthermore, according to embodiments of the present invention, the secondary capacitor electrodes may be formed to have a variety of sizes and shapes. A variety of sizes of secondary capacitor electrodes allows various combinations of tuning electrodes to be connected together to obtain high precision capacitors with relatively small granularity. This results in high precision and/or improved matching of capacitance values.

In various implementations, the capacitors may be connected in parallel to increase the net capacitance. A device with capacitors in parallel may achieve both a high-precision capacitance and a low breakdown voltage (e.g., for easy surveillance tag deactivation). In other implementations, the capacitors may be connected in series to decrease the overall capacitance. Making a device with capacitors in series effectively increases the lateral dimensions of a small capacitor. This configuration may make the capacitor easier to manufacture using techniques that may have relatively limited resolution capabilities. The capacitors of the present invention may be used to make devices, including but not limited to wireless and surveillance and/or identification devices (e.g., EAS, RF, RFID, HF, VHF, and/or UHF, etc.). In addition, the methods and techniques described herein are not limited to capacitors. On the contrary, the methods and techniques described herein for capacitors can be used to connect other structures or devices (e.g., transistors, resistors, etc.) in parallel or in series for analog tuning purposes, such as resistor tuning or transistors with tuning A first aspect of the present invention concerns methods of forming capacitors. In a first general embodiment, a capacitor can be formed by (a) depositing a main capacitor dielectric layer on a conductive substrate; (b) forming a main upper electrode and a plurality of tuning electrodes on the main capacitor dielectric layer; and (c) printing one or more conductive features electrically connecting the main upper electrode to at least one of the tuning electrodes (e.g., in parallel). In exemplary embodiments, the conductive substrate comprises a metal and also serves as a main lower capacitor electrode. In general, the main lower capacitor electrode may be shared by the main capacitor and the tuning capacitors. Furthermore, the conductive feature(s) may comprise one or more conductive straps, lines, or layers. In some embodiments, the main upper electrode and/or the tuning electrodes may be formed by depositing a conducting layer on the capacitor dielectric layer. In general, printing processes may be preferred over conventional blanket deposition, photolithography and etching processes, because printing reduces the number of processing steps, the length of time for the manufacturing process, and/or the cost of materials used to manufacture the capacitor and/or device.

In a second general embodiment, a capacitor can be manufactured by (a) forming a lower electrode pattern on an insulative substrate; (b) depositing a capacitor dielectric layer pattern on the lower electrode pattern; (c) forming a main upper electrode and a plurality of upper tuning electrodes on the capacitor dielectric layer pattern; and (d) printing one or more conductive features electrically connecting the main upper electrode to at least one of the tuning electrodes (e.g., in series). In preferred embodiments, the insulative substrate material is selected from the group consisting of a polyimide, a glass/polymer laminate, or a high temperature polymer.

A second aspect of the present invention concerns a tunable capacitor. In a first general embodiment, the capacitor comprises (a) a main capacitor dielectric layer on a conductive substrate; (b) a main upper electrode and a plurality of tuning electrodes on the main dielectric layer; and (c) one or more printed conducting features electrically connecting the main upper electrode to at least one of the tuning electrodes (e.g., in parallel). In some implementations, the conductive substrate is a metal and comprises a main lower electrode. Preferably, the main lower electrode is shared by the main capacitor and the tuning capacitors of the device. In exemplary implementations, the conducting feature comprises a printed conductive strap.

In a second general embodiment, the capacitor comprises (a) an insulative substrate; (b) a lower electrode pattern on the substrate, the lower electrode pattern comprising a main lower electrode and at least one lower tuning capacitor electrode; (c) a capacitor dielectric layer pattern on the lower electrode pattern; (d) a main upper electrode and a plurality of upper tuning electrodes on the main capacitor dielectric layer; and (e) one or more printed conductive features electrically connecting the main upper electrode to at least one of the tuning electrodes (e.g., in series). In some embodiments, the conductive feature comprises a printed conductive strap.

A third aspect of the present invention concerns devices including tunable capacitors. In one general embodiment, a device comprises (1) one or more capacitors of the present invention; (2) a dielectric layer on the substrate having contact holes therein; and (3) an antenna and/or inductor electrically connected in parallel or in series. In exemplary embodiments, the dielectric layer has one or more contact holes therein to facilitate electrical connection of the antenna. For example, in some embodiments, the dielectric layer may have a first contact hole (or region) exposing the main lower capacitor electrode (or conductive substrate) and a second contact hole (or region) exposing the conductive feature. In other exemplary embodiments, the dielectric layer has a contact hole (or region) exposing one of the upper electrodes (e.g., the main upper electrode or one of the tuning electrodes), and a second contact hole (or region) exposing one of the lower capacitor electrodes (e.g., the main lower electrode or a lower tuning electrode).

A fourth aspect of the present invention concerns methods of making devices including tunable capacitors. In one general embodiment, the method comprises (1) forming a capacitor using one of the methods described herein; (2) forming a dielectric layer on the capacitor, the dielectric layer having contact holes therein; and (3) attaching an antenna and/or inductor to the main lower electrode (or conductive substrate) and the conductive feature (or alternatively one of the upper electrodes). In some embodiments, the antenna/inductor may be printed directly on the dielectric layer to have any desired shape or pattern. In other embodiments, the antenna/inductor may be formed on a second substrate and then attached to the device using suitable methods known in the art. In embodiments having a conductive substrate, the antenna may be formed from the conductive substrate, for example by etching the conductive substrate (see U.S. Pat. No. 7,286,053, the relevant portions of which are incorporated herein by reference).

A fifth aspect of the present invention concerns methods of detecting items to which surveillance and/or identification tags including tunable capacitors are embedded or attached. In general, a surveillance/identification device of the present invention can be detected by (1) causing or inducing a current in the device that is sufficient for the device to radiate, reflect, absorb, or backscatter detectable electromagnetic radiation; (2) detecting the detectable electromagnetic radiation; and (3) optionally selectively deactivating the device or instructing the device to perform an action.

The embodiments described herein enable a tunable capacitor to be fabricated as part of a printed integrated circuit fabrication process. By (digitally) printing a connector to connect a first (main) capacitor with one or more additional (tuning) capacitors, the number of secondary/tuning capacitors connected into the circuit can be determined during the integrated circuit fabrication process, which eliminates the need for individual masks connecting the secondary capacitors. This enables the connection of various sizes and combinations of secondary capacitors to obtain high precision capacitors and/or improved matching of capacitance values. These and other advantages of the present invention will become readily apparent from the detailed description of preferred embodiments below.

BRIEF DESCRIPTION OF THE DRAWINGS

FIGS. 1E-1F show cross-sectional and top-down views, respectively, of an exemplary capacitor having a conductive feature formed thereon connecting the main electrode and a secondary tuning electrode in parallel, according to embodiments of the present invention.

FIG. 1G shows a top-down view of an exemplary capacitor having a conductive feature formed thereon connecting the main electrode and one of a plurality of secondary tuning electrodes in parallel, according to embodiments of the present invention.

FIGS. 4A-4B show cross-sectional and top-down views, respectively, of an intermediate in an exemplary method for making series connected capacitors according to embodiments of the present invention.

FIGS. 4G-4H show cross-sectional and top-down views, respectively, of an exemplary capacitor having a conductive feature formed thereon connecting the main capacitor electrode and a secondary tuning electrode in series, according to embodiments of the present invention.

FIGS. 4K-4L show cross-sectional and top-down views, respectively, of the capacitor of FIGS. 4I-4J having a third conductive feature formed thereon connecting additional tuning capacitors in series.

DETAILED DESCRIPTION

Figure 1A:
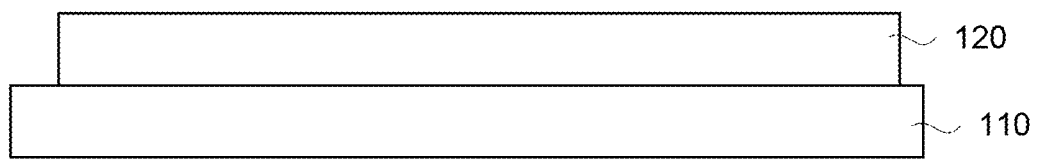
FIGS. 1A-1B show cross-sectional and top-down views, respectively, of an intermediate in an exemplary method for making parallel tuning capacitors according to embodiments of the present invention.

Reference will now be made in detail to embodiments of the present invention, examples of which are illustrated in the accompanying drawings. While the invention will be described in conjunction with various embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. In addition, it should be understood that the possible permutations and combinations described herein are not meant to limit the invention. Specifically, variations that are not inconsistent may be mixed and matched as desired.

For the sake of convenience and simplicity, the terms "coupled to," "connected to," and "in communication with" mean direct or indirect coupling, connection or communication unless the context indicates otherwise. These terms are generally used interchangeably herein, but are generally given their art-recognized meanings Also, for convenience and simplicity, the terms "surveillance," "identification," "EAS," "RF," and "RFID," may be used interchangeably with respect to intended uses and/or functions of a device and/or tag, and the terms "EAS tag" or "EAS device" may be used herein to refer to any EAS and/or surveillance tag and/or device. In addition, the terms "item," "object" and "article" are used interchangeably, and wherever one such term is used, it also encompasses the other terms. Furthermore, the term "capacitor electrodes" may refer to one or more of main upper capacitor electrodes, main lower capacitor electrodes, upper tuning capacitor electrodes, and/or lower tuning capacitor electrodes. Also, the terms "feature," "shape," "line," "strap," and "pattern" may be used interchangeably, and generally refer to an electrically conductive structure of a semiconductor device. The terms "(semi)conductor," "(semi)conductive," "(semi)conducting" and grammatical equivalents thereof refer to materials, precursors, layers, features or other species or structures that are conductive and/or semiconductive.

In the present application, the term "deposit" (and grammatical variations thereof) is intended to encompass all forms of deposition, including blanket deposition (e.g., CVD, ALD, and PVD), (spin)coating, and printing. In general, "coating" refers to a process where an ink or other material is deposited on substantially the entire substrate or surface, whereas "printing" generally refers to a process where an ink or other material is (selectively) deposited in a predetermined pattern in certain areas of the substrate or surface. In various embodiments, coating may comprise spin-coating, spray-coating, slit coating, extrusion coating, meniscus coating, and/or pen-coating. In other embodiments, printing may comprise inkjet printing, gravure printing, offset printing, flexographic printing, screen printing, microspotting, stenciling, stamping, syringe dispensing, pump dispensing, laser forward transfer, local laser CVD, and/or pen-coating.

Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. In addition, the term "doped" refers to a material that is doped with a substantially controllable dose of any dopant (e.g., lightly doped, heavily doped, or doped at any doping level in between).

Various embodiments of the present invention relate to tunable capacitors and methods of making tunable capacitors. Other embodiments of the present invention relate to devices including such tunable capacitors, and methods of making the same. Still, further embodiments of the present invention relate to methods of detecting items using the various devices described herein.

The invention, in its various aspects, will be explained in greater detail below with regard to exemplary embodiments. While some embodiments relate primarily to surveillance and/or security tags or devices, the present methods and structures are also useful in identification and other (wireless) devices that include one or more antennas and/or inductors, capacitors, and connections therebetween.

Exemplary Methods of Forming Parallel or Series Capacitors

Exemplary methods of forming tunable capacitors, and devices having tunable capacitors, are discussed herein. In addition, a detailed discussion regarding general methods that may be used to form any of the tunable capacitors and/or devices described in the various embodiments, as well as the individual structures of such devices, is also provided herein.

An Exemplary Method of Forming Parallel Capacitors

In a first exemplary embodiment, the method of forming a capacitor comprises (a) depositing a main capacitor dielectric layer on a conductive substrate; (b) forming a main upper electrode and a plurality of tuning electrodes on the main capacitor dielectric layer; and (c) printing one or more conductive features electrically connecting the main upper electrode to at least one of the tuning electrodes. In some embodiments, the conductive substrate comprises a metal (e.g., a metal foil or sheet), and preferably, the metal substrate serves as a main lower capacitor electrode. A device (e.g., RF, RFID, EAS, HR, VHF, UHF, etc.) may be made using the capacitor by forming an antenna and/or inductor on the capacitor, or otherwise attaching an antenna/inductor to the capacitor. A detailed description of forming a device from the capacitors of the present invention is provided herein.

i. Preparing the Substrate

Figure 1B:
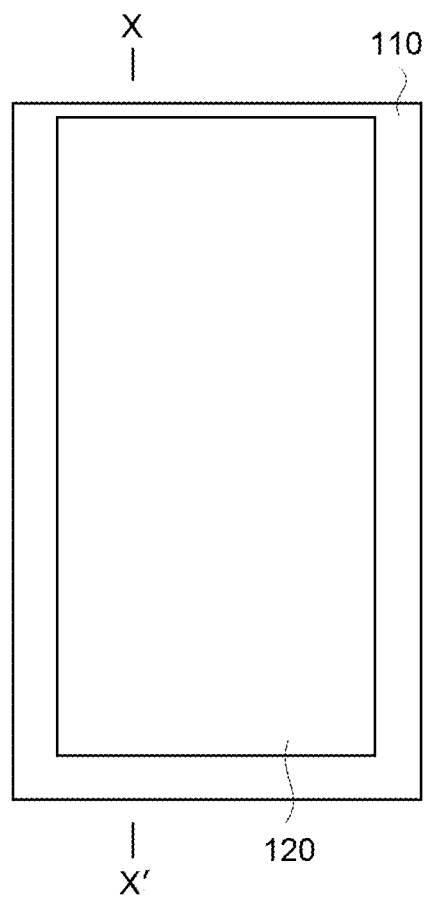

A first exemplary embodiment is described with reference to FIGS. 1A-1J. FIG. 1A shows a cross-sectional view along the X-X' axis in the corresponding top-down view of FIG. 1B. Specifically, FIGS. 1A and 1B show a conductive (e.g., electrically functional) substrate 110 with a main capacitor dielectric layer 120 formed thereon. In exemplary embodiments, the conductive substrate 110 comprises a metal, and serves as a main lower electrode of the capacitor. In such embodiments, the metal substrate may be shared by the main upper capacitor electrode and the plurality of tuning electrodes in the device.

In exemplary embodiments, the conductive substrate comprises a metallic substrate, metal film, metal foil, or metal sheet, or a laminated or layered combination thereof, any of which may further include one or more barrier coats. For example, in various implementations, the metal of the substrate may comprise aluminum, titanium, copper, silver, chromium, molybdenum, tungsten, nickel, gold, palladium, platinum, zinc, iron, or an alloy thereof (e.g., steel or stainless steel). Other suitable conductive substrates are discussed in detail herein with regard to exemplary capacitors (see the section entitled "The Substrate" herein). In some implementations, the metal for the conductive substrate may be chosen at least in part based on its ability to be anodized to form an effective capacitor dielectric (e.g., Al). In general, the substrate may have a nominal thickness of from 1-300 µm (e.g., 5-200 µm or any other range of values therein, for example 20-100 µm in those embodiments in which a high Q is advantageous). Additionally or alternatively, the conductive substrate may have a resistivity of from about 0.1 µohm-cm to about 100 µohm-cm (e.g., 0.5-80 µohm-cm, or any other range of values therein).

It may be advantageous to use an anodized or "clean" (non-anodized) Al, Al/Cu, Cu, stainless steel or similar metal foil as the substrate. Examples of such substrates can be found in U.S. Pat. Nos. 7,152,804 and 7,286,053, the relevant portions of each of which are incorporated herein by reference. In various embodiments, the substrate may have one or more insulating, planarizing, buffering, or other materials coated or otherwise deposited thereon. The substrate is conventionally cleaned and optionally coated with a barrier material (such as silicon dioxide, aluminum oxide, or a conductive barrier such as titanium nitride) before further processing. The coating step may comprise oxidation and/or anodization of a surface material of the substrate (e.g., a metal foil); deposition of a spin-on or fluid barrier composition; sputtering, CVD, or spray coating a barrier material onto the substrate, or a combination of any of these processes (see, e.g., co-pending U.S. patent application Ser. No. 11/243,460, filed on Oct. 3, 2005, the relevant portions of which are incorporated herein by reference).

In some implementations, prior to subsequent processing, the surface of the conductive substrate may be conventionally cleaned and/or smoothed by electropolishing, chemical polishing, and/or oxide stripping to reduce surface roughness and to remove low quality native oxides. A description of such cleaning processes is given in, "The Surface Treatment and Finishing of Aluminum and Its Alloys," by P. G. Sheasby and R. Pinner, sixth edition, ASM International, 2001, the relevant portions of which are incorporated herein by reference.

ii. Forming the Main Capacitor Dielectric Layer

Referring again to FIGS. 1A and 1B, the method further comprises forming a main capacitor dielectric film or layer 120 on the conductive substrate 110. The main capacitor dielectric film may be formed according to any suitable method known in the art. For example, in some implementations, the main capacitor dielectric layer may be formed by oxidizing and/or nitriding the conductive substrate in an oxidizing and/or nitriding atmosphere. Alternatively, a liquid oxide or nitride precursor can be formed on the substrate (e.g., by a blanket deposition technique such as spin-coating or by a selective deposition technique such as printing), and converted to the oxide or nitride by heating in an oxidizing and/or nitriding atmosphere. In some variations, the dielectric layer can be formed by oxidizing a liquid silane printed onto the metal substrate (e.g., steel), or by coating the substrate with another conductive material that can be oxidized or nitrided (e.g., silicon, aluminum, chromium, hafnium, etc.).

In other embodiments, the dielectric layer 120 may be formed by depositing (e.g., by printing processes, or by blanket depositing or coating) a dielectric precursor material (e.g., a $SiO_2$ precursor such as tetraalkylsiloxane or tetraalkoxysilane) and subsequently converting the precursor to a dielectric film, for example, by drying, curing, and/or annealing). However, if the conductive substrate is one that cannot be processed at high temperatures (e.g., aluminum), methods such as printing or vapor deposition are generally preferred. After converting the precursor material to a dielectric film, additional metal oxides (e.g., $TiO_2$, $ZrO_2$, $HfO_2$, etc.) may be deposited on the film. Thus, in some implementations, the main capacitor dielectric may comprise a plurality of layers.

In some embodiments, the main capacitor dielectric film/layer 120 may be coated or deposited by blanket deposition techniques. In general, coating refers to a process where substantially the entire surface of a substrate is covered with the dielectric precursor formulation. For example, coating may comprise methods such as spray coating, dip coating, blade coating, meniscus coating, slit coating, extrusion coating, pen-coating, microspotting, inkjetting, gravure printing, flexographic printing, or spin-coating. In such embodiments, areas of the substrate may be patterned as desired by etching techniques known in the art. For example, patterning may comprise direct printing of the dielectric precursor materials or indirect patterning (such as with a photo- and/or thermo-patternable precursor material that is exposed by a photo-mask, thermal or laser pattern and developed) or a patterning process such as conventional photolithography, embossing or similar technique. In some embodiments, the etching process may comprise laser ablation, mechanical penetration, wet etching or other etching or dielectric removal techniques know in the art. In some variations, the dielectric layer 120 can be blanket deposited, and then a conventional edging technique can be used to remove the outer 0.001 to 10 mm of the dielectric layer.

In other embodiments, the main capacitor dielectric layer 120 can be deposited by vacuum deposition methods (e.g., CVD, PECVD, LPCVD, sputter deposition, etc.). In one implementation, the dielectric layer can be formed by anodization resulting in a MOS dielectric and/or a deactivation dielectric. A detailed description of forming the dielectric by anodization is found in U.S. Pat. No. 7,286,053, the relevant portions of which are incorporated herein by reference.

Referring still to FIGS. 1A and 1B, in some implementations, the dielectric (or suitable dielectric precursor) can be selectively deposited (e.g., by printing) onto the conductive substrate to form a desired pattern. During the printing process, a liquid-based composition (e.g., a solution, suspension, emulsion, etc.) is selectively deposited in a predetermined pattern, and with a characteristic resolution (e.g., minimum layout dimension, spacing, alignment margin of error, or any combination thereof). Selective deposition may be accomplished using any of the various printing processes and/or techniques discussed herein (e.g., inkjet printing, gravure printing, screen printing, etc.).

In some implementations, the main capacitor dielectric layer 120 may be formed by (i) printing a liquid-phase dielectric precursor ink on at least predetermined portions of the conductive substrate 110, and (ii) drying and/or curing the dielectric precursor/ink to form the main capacitor dielectric layer 120. Optionally, the liquid-phase dielectric precursor ink may be selectively printed on the structure such that predetermined areas of the conductive substrate are exposed. In the alternative, the dielectric layer may be printed to cover the entire substrate. In such embodiments, the capacitor dielectric layer may optionally be etched using any of the techniques described herein using subsequently formed structures as a mask.

The liquid-phase dielectric precursor ink used in printing and/or coating processes may comprise a spin on glass, an organic dielectric, etc. Other suitable dielectric materials are discussed in detail below with regard to exemplary capacitors and devices (see, e.g., the section entitled "Exemplary Dielectric Film Layers" herein). In addition, other various techniques for forming the main capacitor dielectric layer, and the benefits thereof, are described in U.S. Pat. No. 7,286,053, the relevant portions of which are incorporated herein by reference.

In various embodiments, the main capacitor dielectric layer (e.g., structure 120 of FIGS. 1A and 1B) has a thickness of from 20 Å to 2 μm (e.g., 20 Å to 1,000 Å, 1,000 Å to 2 μm; 50 to 500 Å, or any other range of values therein). Additionally or alternatively, the main capacitor dielectric layer may have a breakdown voltage of from about 5 V to less than 50 V, preferably from 10 V to 20 V. However, the dielectric thickness may be selected to control the capacitance of the device, and in the case of use in a surveillance and/or identification device, to control the voltage at which the dielectric is intended to rupture.

iii. Forming the Main Upper Electrode and the Tuning Electrodes

Figure 1C:
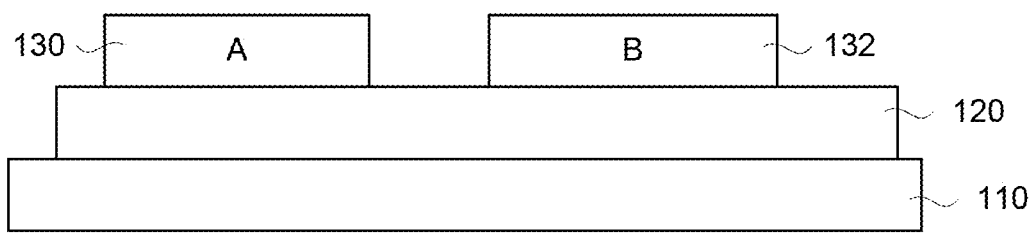
FIGS. 1C-1D show cross-sectional and top-down views, respectively, of another intermediate in the exemplary method for making parallel tuning capacitors according to embodiments of the present invention.
Figure 1D:
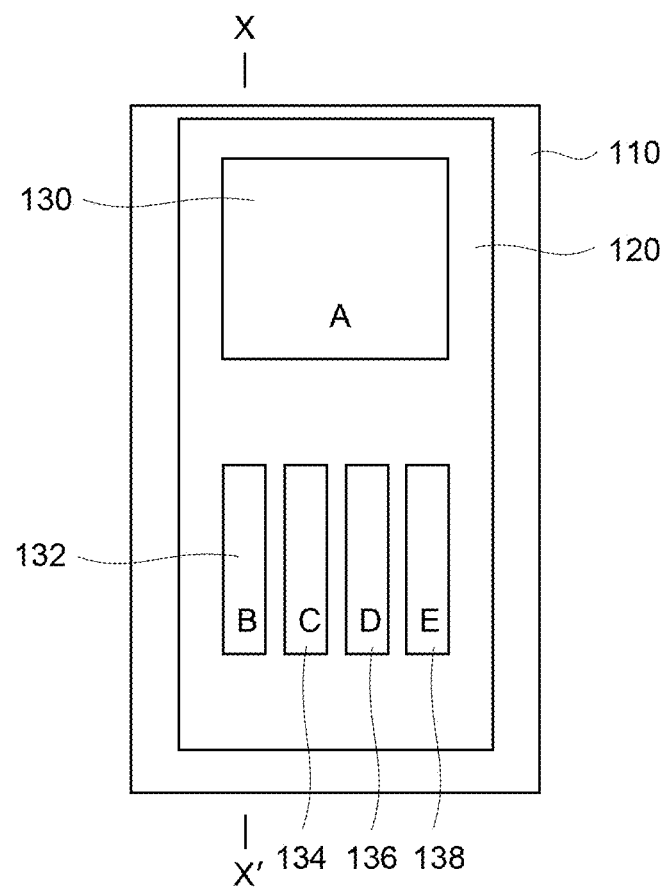

The present method further comprises forming a main upper capacitor electrode and one or more tuning capacitor electrodes on the main capacitor dielectric film layer. For example, FIG. 1D shows a top-down view of a main upper capacitor electrode 130 (i.e., corresponding to capacitor A), and a plurality of tuning electrodes 132, 134, 136, and 138 (i.e., corresponding to tuning capacitors B, C, D, and E, respectively) on the main capacitor dielectric layer 120. FIG. 1C shows a cross-sectional view of FIG. 1D along the X-X' axis. The main upper electrode 130 and the tuning capacitor electrodes (e.g., 132, 134, 136, and 138 of FIG. 1D) may be formed by depositing a conductive layer (e.g., a conductive metal, a nitride, a metal alloy, etc.) or semiconductive layer (e.g., a lightly doped, heavily doped, or undoped semiconductor) on the main capacitor dielectric layer 120. The conductive or semiconductive layer may be deposited using any suitable method known in the art. For example, the metal and/or semiconductor material may be deposited by printing or conventional blanket deposition/coating processes (e.g., by chemical vapor deposition [CVD], low pressure CVD, sputtering, electroplating, spin coating, spray coating, etc.). If the layer for the upper electrodes is blanket-deposited, it may be patterned by photolithography and etching. However, printing processes are preferred.

In some exemplary embodiments, a metal ink is selectively deposited on the main capacitor dielectric layer by printing an ink comprising a precursor of a desired metal (e.g., a silicide-forming metal) in a solvent, and subsequently curing, drying, and/or annealing the metal. In various embodiments, printing may comprise inkjet printing, gravure printing, screen printing, offset printing, flexography, syringe dispensing, laser writing, microspotting, stenciling, stamping, pump dispensing, laser forward transfer, local laser CVD and/or pen-coating. One can control the thickness of the printed metal/(semi)conductive layer. In some variations, a cleaning and/or surface roughening process may be applied to the dielectric layer before the metal ink is deposited (e.g., by printing). Such a cleaning or surface roughening process may improve the adhesion of the plated metal to the dielectric layer. For example, the dielectric layer may be etched before printing the metal ink to improve the adhesion of the printed metal to the dielectric layer.

In other exemplary embodiments, the main upper electrode and tuning electrodes are formed by depositing a conductor (e.g., metal-containing ink) on the main capacitor dielectric layer using any of the blanket deposition or coating techniques described herein. For example, in one implementation, the metal may be deposited by spin-coating an ink (e.g., a metal precursor ink, etc.) containing a precursor of the conductive material (e.g., a metal or organometallic compound or complex, metal nanoparticles, etc). In this embodiment, the ink may then be dried, cured, and annealed to form the conductive layer.

The conductor (metal-containing) ink may comprise precursors of any of the elemental metals (or metal alloys) described herein. For example, the precursor may include nanoparticles, salts, clusters, complexes, compounds, nitrides, and/or silicides of the elemental metal or metal alloy. In exemplary embodiments, the metal-containing precursor ink may comprise or consist essentially of the metal precursor (e.g., metal-containing material) in an amount of from 1 to 50 wt. % of the ink (or any range of values therein), and a solvent in which the metal-containing material is soluble. The precursor ink can be printed, dried, cured, and/or annealed to form the film containing the metal or metal alloy (see U.S. Pat. Nos. 8,066,805 and 8,158,518, the relevant portions of which are incorporated herein by reference). Suitable elemental metals for forming the main upper capacitor electrode and/or the tuning electrode(s) may include aluminum, titanium, vanadium, chromium, molybdenum, tungsten, iron, nickel, palladium, platinum, copper, zinc, silver, gold, etc. Suitable metal alloys may include aluminum-copper alloys, aluminum-silicon alloys, aluminum-copper-silicon alloys, titanium-tungsten alloys, Mo—W alloys, aluminum-titanium alloys, etc.

In some implementations, the conducting ink may comprise one or more semiconductor compounds, which may be lightly or heavily doped. In some instances, it may be desirable to provide a relatively low level of doping (a concentration of $<5\times10^{18}$ $cm^{-3}$ of the electrically active dopant atoms) in the bulk of the active semiconductor layer to control the CV slope of a device including the tunable capacitor. Low dopant levels also reduce the series resistance of the semiconductor component, thereby allowing higher Q and/or higher frequency operation (see, e.g., U.S. Pat. No. 7,286,053, the relevant portions of which is incorporated herein by reference).

In some embodiments, the main upper capacitor electrode 130 and/or the tuning electrodes (e.g., 132) may be printed as a mixture of two or more metal precursors. In the alternative, the upper capacitor electrode and/or tuning electrodes may be a mixture of one or more metal precursors, and one or more semiconductor precursors. In other embodiments, two or more metal inks may be successively printed and dried as laminated layers. The mixtures and/or laminates can be optionally heated or otherwise reacted during or after formation to form the main upper capacitor electrode and/or the tuning electrodes.

As discussed with regard to FIGS. 1C-1D, the metal-containing precursor ink is deposited (e.g., by printing) in a predetermined pattern on the main capacitor dielectric layer 120. The metal-containing precursor ink may then be dried to remove any solvent in the ink. In general, drying the ink comprises heating the substrate at a temperature and for a length of time sufficient to remove the solvent. Suitable temperatures for removing solvents range from about 80° C. to about 150° C., or any range of temperatures therein (e.g., from about 100° C. to about 120° C., etc.). Within these temperature ranges, the length of time for removing solvents from the ink ranges from about 1 second to about 10 minutes, 10 seconds to about 5 minutes, or any range of times therein (e.g., from about 30 seconds to about 5 minutes, or about 1 minute to 3 minutes, etc.). Heating may take place on a conventional hotplate or in a conventional furnace or oven. Optionally, the heating may occur in an inert atmosphere as described in U.S. Pat. No. 7,767,520, the relevant portions of which are incorporated herein by reference.

After the precursor ink has been dried to remove the solvent, the remaining material may be cured (e.g., to densify, cross-link, drive off volatile impurities, etc.) and/or annealed (e.g., to improve electrical properties of the film, etc.) at a temperature and for a length of time sufficient to obtain desired electrical and/or physical properties. In addition, the annealing process may be advantageous for obtaining proper adhesion to the underlying dielectric layer. In general, suitable annealing temperatures range from about 100° C. to about 600° C., or any range of temperatures therein (e.g., from about 100° C. to about 300° C., from about 150° C. to about 250° C., etc.). Within these temperature ranges, the annealing time generally ranges from about 1 minute to about 2 hours. In preferred embodiments, the metal-containing film is annealed from about 10 minutes to about 1 hour (or any range of values therein, e.g., from about 10 to about 30 minutes).

In some implementations, annealing occurs in a furnace or oven. Optionally annealing may occur in an inert or reducing atmosphere. For example, the metal-containing precursor film may be exposed to a reducing agent, and heated at a temperature ranging from greater than ambient temperature to about 200-400° C., depending on the substrate. This process has particular advantages in embodiments where the substrate cannot be processed at a relatively high temperature (e.g., aluminum foil, a polycarbonate, polyethylene and polypropylene esters, a polyimide, etc.). A sealable oven, furnace, or rapid thermal annealing furnace configured with a vacuum source and reducing/inert gas sources may be used to provide the reducing atmosphere and heat (thermal energy) for heterogeneous reduction. Alternatively, the metal precursor film may be thermally decomposed to the elemental metal using a heat source (e.g., a hotplate) in an apparatus in which the atmosphere may be closely controlled, such as a glove box or dry box. Annealing and/or reducing processes, and alternatives thereof, are described in U.S. Pat. Nos. 7,767,520 and 8,066,805, the relevant portions of which are incorporated herein by reference.

When a tunable capacitor is used in a device (e.g., a wireless, or surveillance and/or identification device), and the main capacitor electrode and/or tuning electrodes comprise a semiconductor layer, it may be desirable to recrystalize the material used to form the semiconductor layer to achieve sufficiently low series resistance for the circuitry in the device and/or increase the frequency response of the capacitor (e.g., MOS capacitor circuit). In turn, this enables high frequency operation (e.g., in the range of 125 KHz and above, including, for example, 8.2 MHz or 13.56 MHz). In such embodiments, the recrystallization process may improve the carrier mobility and/or dopant activation of the conductive layer/semiconductor component. Mobilities approaching 10 $cm^2$/vs and higher may be required for low dissipation and/or effective high Q. Low dissipation generally requires low series resistance, preferably less than 5 Ohms for the entire circuit, along with a large parallel resistance (generally provided by a low leakage dielectric) of at least $10^4$ Ohms, preferably >$10^5$ Ohms, most preferably >$10^6$ Ohms. Effective high Q provides low field and/or high read range operation in MHz range frequencies and higher. Preferred techniques for recrystallization are described in U.S. Pat. No. 7,286,053, the relevant portions of which are incorporated herein by reference.

In some variations, the main capacitor electrode and/or the tuning electrodes may be formed by electro(less) plating processes. In such embodiments, a printed metal layer (e.g., Pd, Pt, Co, etc.) serves as a seed layer for electroless deposition or plating (e.g., electroplating or electroless plating) of other (bulk) metals (e.g., Ag, Cu, Ni, Al, Au, Pd, etc.). Exemplary methods and materials for printing metal via seed printing and plating are described in U.S. Pat. No. 8,158,518 and co-pending U.S. patent application No. 12/243,880 filed on Oct. 1, 2008, the relevant portions of which are incorporated herein by reference.

Figure 1H:
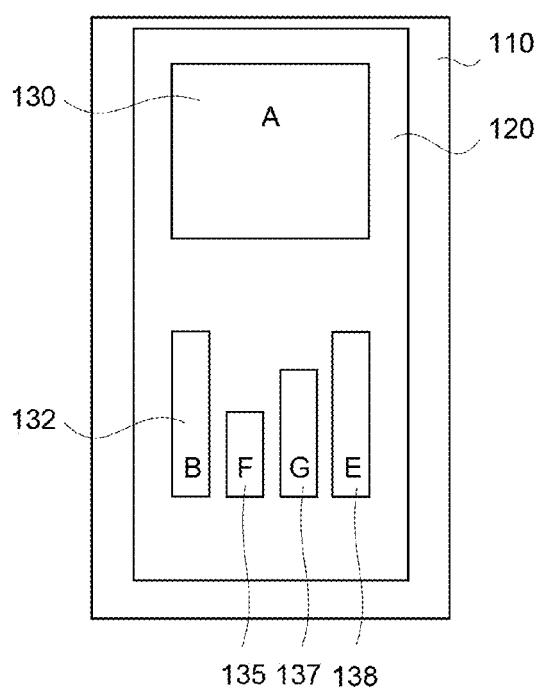
FIG. 1H shows a top-down view of an exemplary capacitor having a plurality of secondary tuning electrodes with varying sizes.

The tuning capacitors can have varying sizes, as seen in FIG. 1H. For example, in the embodiment shown in FIG. 1H, tuning capacitor electrode 135 (corresponding to capacitor F) and tuning capacitor electrode 137 (corresponding to capacitor G) have a smaller size/surface area than tuning electrodes 132 and 138 (corresponding to capacitors B and E, respectively). Printing a variety of sizes of tuning (e.g., secondary) capacitor electrodes enables a variety of combinations of electrodes to be electrically connected with one another. This provides high precision capacitors with relatively small granularity, and results in high precision and/or improved matching of capacitance values.

iv. Forming the Conductive Feature(s)

Referring now to FIGS. 1E-1G, in general, a conductive feature 140 (e.g., a conductive "strap," "line," "pattern," and/or "shape") is formed on at least part of the main capacitor electrode 130, the main capacitor dielectric layer 120, and one (or more) of the tuning electrodes (e.g., structure 132 of FIGS. 1F-1G). The conductive feature 140 serves as a connector between the main capacitor electrode 130 and the tuning capacitor electrodes (e.g., 132, 134, 136, and/or 138). The desired total capacitance of the device can be predetermined, and the tuning electrodes can be connected to the main upper electrode to achieve the desired total capacitance.

Specifically, FIGS. 1F and 1G show top-down views of the conductive feature 140 electrically connecting the main upper electrode 130 to one tuning electrode 132 according to one embodiment of the present invention. FIG. 1E shows a cross-sectional view of either FIG. 1F or 1G along the X-X' axis. In the embodiment of FIG. 1F, only one tuning electrode 132 and one conductive feature 140 are formed and connected on the device. However, the method is not limited as such. On the contrary, a plurality of tuning electrodes and/or conductive features may be formed and connected in various combinations, as shown in FIGS. 1I-1J, and as discussed in detail below.

In general, the main upper capacitor electrode 130 and the main lower capacitor electrode (e.g., conductive substrate 110) form a first capacitor (structure A of FIGS. 1E-1G). The capacitance of the first capacitor A (or the thickness of the main capacitor dielectric film 120) can be measured during the manufacturing process. If the total capacitance is less than the desired (or predetermined) total capacitance, then one or more additional capacitors (e.g., capacitor B of FIGS. 1E-1F and/or capacitors B, C, D, and E of FIG. 1G) can be formed and electrically connected to the main capacitor A, or to other points in the circuit (not shown in FIGS. 1E-1G). The additional capacitors are formed between the upper tuning electrodes 132/134/136/138 and the lower capacitor electrode 110, and are generally connected to the first capacitor A with a conducting layer (e.g., conductive feature 140) to obtain the desired total capacitance.

Figure 1I:
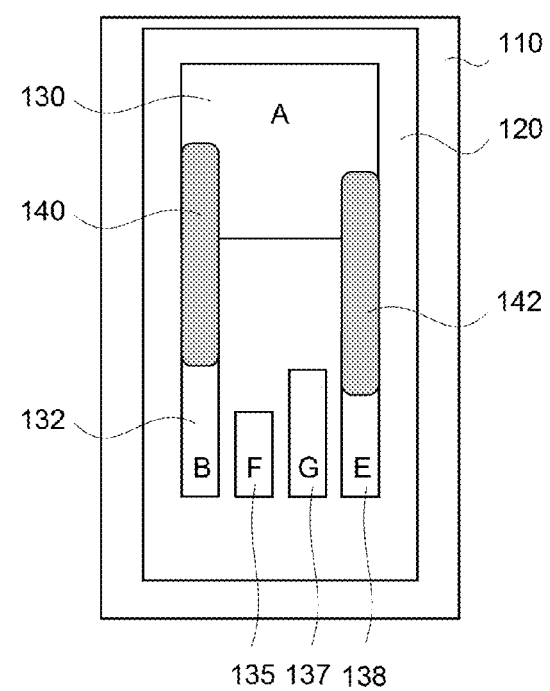
FIGS. 1I-1J show top-down views of the capacitor of FIG. 1H with a plurality of conductive features formed thereon connecting the main electrode and a plurality of the secondary tuning electrodes in parallel.
Figure 1J:
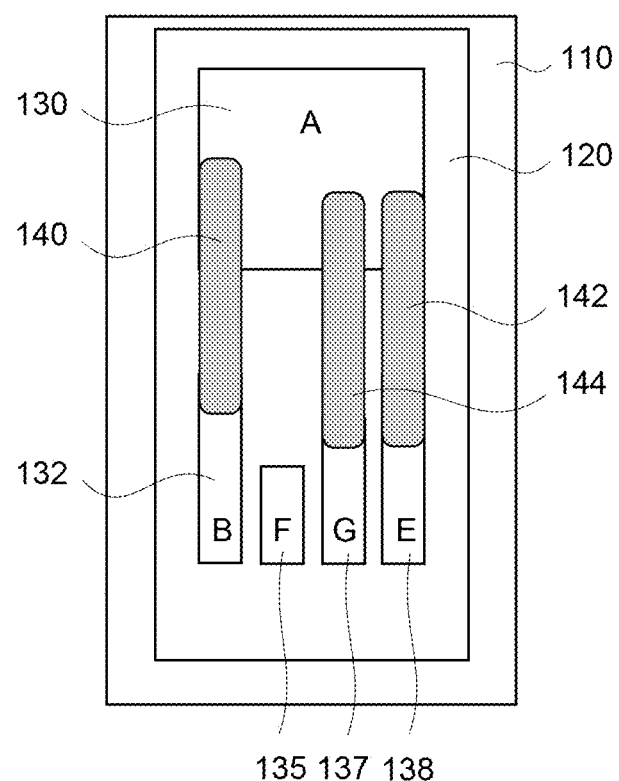

If increased capacitance is desired, additional conductive features can be formed to connect the main capacitor A with additional tuning capacitors (e.g., capacitors B and E in FIG. 1I and capacitors B, E, and G in FIG. 1J), and as previously discussed herein, the tuning capacitors can have different sizes (see, e.g., capacitors F and G in FIGS. 1H and 1I). Varying the size of the tuning capacitors and the number of conducting features connecting the tuning capacitors with the main capacitor provides a method for customizing the device, and results in high precision and/or improved matching of capacitance values.

The conductive feature (e.g., structures 140, 142, and/or 144 in FIGS. 1F-1J) may comprise a shape, line, and pattern, or a strap. In preferred embodiments, the conductive feature is a strap. The conductive feature(s) can be formed using any suitable method known in the art. For example, in exemplary embodiments, the conductive feature is formed by any of the printing processes discussed herein. In exemplary embodiments, the conductive feature is formed by depositing (e.g., by printing) a conducting layer (e.g., a conductive metal, a nitride, a metal alloy, etc.) or semiconducting layer (e.g., lightly doped, heavily doped, or undoped) on at least part of the main upper electrode 130, at least part of the tuning capacitor to which the main upper electrode 130 is to be electrically connected, and on the main capacitor dielectric layer 120. In other embodiments, the conductive feature(s) may be deposited by blanket deposition/coating processes described herein, and photolithography and etching, or alternatively by printing a conductive seed layer, and then electroplating or electrolessly plating a bulk conductor thereon, as previously discussed herein.

In one preferred embodiment, the conductive feature is formed by digitally printing a metal precursor in a desired pattern. Digitally printing the conductive feature(s) allows the number of secondary capacitors (B, C, D, etc.) connected to the main capacitor A to be determined or selected during the integrated circuit fabrication process without the need for individual masks connecting the appropriate number of secondary tuning capacitors. This provides an in-process or post-process trimming method to obtain the desired precision and accuracy for capacitors.

The conductive feature(s) may be formed using any of the materials/metals discussed herein with regard to forming conductive/semiconductive structures (see, e.g., the section entitled "Forming the Main Upper Electrode and the Tuning Electrodes" herein). In exemplary embodiments, the conductive feature(s) comprises or consists essentially of a conductive metal, a nitride, or a metal alloy. In one variation, the conductive feature(s) is formed from the same material as the main capacitor electrode, the tuning capacitor electrode(s), and/or the conductive substrate. However, the method is not limited such, and the conductive feature(s) may be formed from different materials than those of the conductive substrate and the main capacitor electrode and/or tuning electrodes. In some implementations, dopants, siliciding components, or other work function modulation agents and/or tunneling barrier materials may be included in the conductive feature(s). This may reduce the resistance and increase the Q, and overall performance of the device.

v. Forming an Antenna and/or Inductor

In some implementations, an antenna and/or inductor may be formed on the tunable capacitor (e.g., the capacitor of FIGS. 1E-1F), and coupled with, or electrically connected to the conductive feature and the lower capacitor electrode (or conductive substrate) to make a device (e.g., wireless device or tag, EAS, RF, RFID, HF, VHF, UHF, etc.).

Figure 3A:
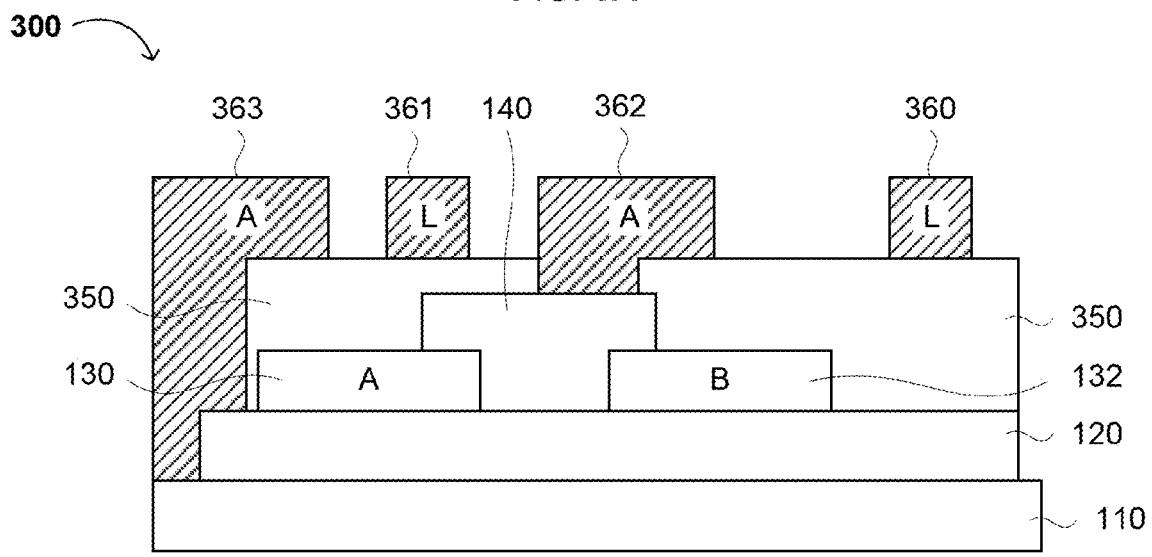
FIGS. 3A-3B show cross-sectional and top-down views, respectively, of an exemplary device with capacitors connected in parallel, according to embodiments of the present invention.
Figure 3B:
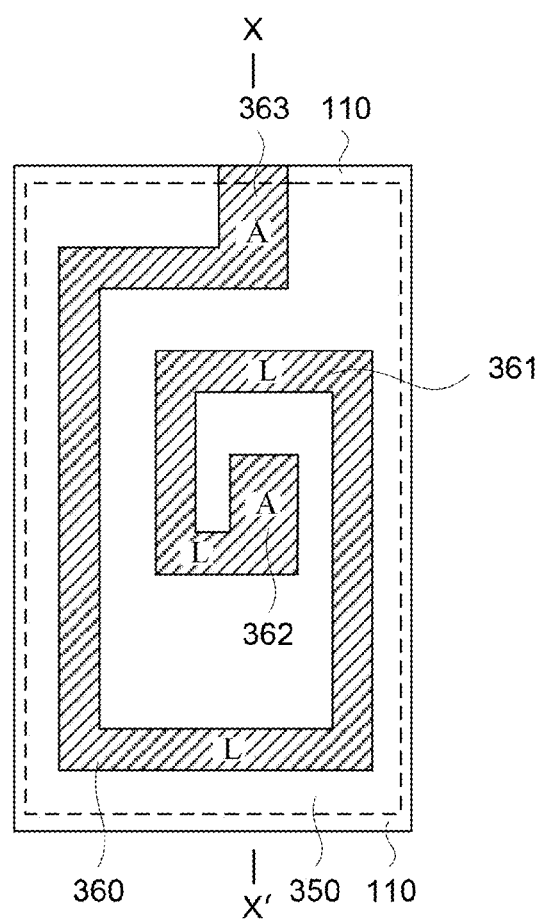

FIG. 3B shows a top-down view of an exemplary device 300 having capacitors connected in parallel. FIG. 3A shows a cross-sectional view of FIG. 3B along the X-X' axis. As shown in FIG. 3A, an antenna 360-363 is formed on the capacitor of FIGS. 1E-1F (e.g., capacitor 100). In exemplary embodiments, prior to forming the antenna and/or inductor 360-363, a second dielectric layer 350 (e.g., an interlayer dielectric film) is formed in a predetermined pattern on or over at least a part of the substrate 110, the main capacitor dielectric film 120, the capacitor electrodes 130/132, and the conductive feature 140, as shown in FIG. 3A. The second dielectric layer 350 provides electrical separation (e.g., in terms of leakage and capacitance) between the subsequently formed inductor and/or antenna and the upper capacitor electrodes and the conductive feature. The second dielectric layer may be formed according to any suitable method and using any suitable material as described herein with regard to forming the main capacitor dielectric layer.

The second dielectric layer 350 generally has contact holes (not shown in FIG. 3B) formed therein exposing at least a portion of the conductive feature 140 and/or the conductive substrate 110. In some embodiments, the dielectric layer 350 can be selectively printed using any of the printing techniques described herein to include the contact holes. The dielectric layer may be subsequently etched to widen the contact holes as desired.

As shown in FIGS. 3A and 3B, the antenna and/or inductor 360-363 may be formed on the structure, and coupled with, or electrically connected to, the conductive feature 140 and/or the upper capacitor electrodes (e.g., the main upper capacitor electrode 130 and/or the tuning capacitor electrode 132) and the conductive substrate 110 to form the device 300 connected in parallel. The antenna and/or inductor may comprise the antenna, the inductor, or both. In some embodiments, the antenna/inductor may include contact pad regions (not shown in FIGS. 3A-3B), which may comprise a metal bump or anisotropic conductive paste (ACP).

In general, the antenna/inductor may be formed using any of the methods described herein with regard to conductive structures (e.g., capacitor electrodes, conductive features, etc.). The antenna/inductor may be formed with any shape and size suitable for placement on the tag or device (e.g., a coil or a spiral shape, a zig-zag pattern, etc.), and can be made using any of the conductive materials described herein. For example, the antenna and/or inductor may have a thickness of from 1 to 100 μm and a resistivity of from 0.1 to 100 μohm-cm (or any range of values therein). Exemplary methods of forming an antenna and/or inductor are described in detail in U.S. Pat. Nos. 7,152,804 and 7,286,053, and in co-pending U.S. patent application Ser. Nos. 12/249,735 and 12/467,121, respectively filed on Oct. 10, 2008 and May 15, 2009, the relevant portions of which are incorporated herein by reference. In further embodiments, an additional support or backing layer may be added to a surface of the antenna/inductor to provide additional mechanical support, stability, and/or protection to the device, particularly during subsequent processing steps (see co-pending U.S. patent application Ser. No. 12/467,121, filed on May 15, 2008, the relevant portions of which are incorporated herein by reference).

vi. Passivation

Although not shown in FIGS. 3A-3B, in some embodiments, the present method may further comprise forming a passivation layer over the structures on the substrate (e.g., the antenna/inductor, the capacitor electrode(s), the conductive feature(s), etc.). Forming a passivation layer may inhibit or prevent the ingress of water, oxygen, and/or other species that might cause degradation or failure of the integrated circuitry/device. Suitable materials for forming the passivation layer, as well as exemplary characteristics (e.g., length, width, thickness, etc.) are described in detail below with regard to exemplary capacitors and devices including the same (see the section entitled "The Passivation Layer" herein).

The passivation layer may be formed by coating the upper surface of the structure with one or more inorganic barrier layers such as a polysiloxane and/or a nitride, oxide and/or oxynitride of silicon and/or aluminum, and/or one or more organic barrier layers such as parylene, a fluorinated organic polymer or other barrier material known in the art. In some variations, the passivation layer may comprise an underlying dielectric layer, which may be formed using any of the methods described herein. The underlying dielectric layer may be formed from a material having lower stress than that of the overlying passivation layer. To illustrate, the underlying dielectric layer may comprise an oxide (e.g., $SiO_2$, TEOS, undoped silicate glass [USG], fluorosilicate glass [FSG], borophosphosilicate glass [BPSG], etc.), and the passivation layer may comprise silicon nitride or a silicon oxynitride. In some embodiments, the passivation layer may have a thickness that is slightly greater than the thickness of the dielectric layer(s) separating various active components of the circuit.

An Exemplary Method of Forming a Series Capacitor

An exemplary method for forming a series capacitor is described in detail below with reference to FIGS. 4A-4L, and an exemplary method for forming a device including the tunable capacitor of FIGS. 4A-4L is described with reference to FIGS. 5A-5D. Some of the steps and/or processes of the method for forming a series capacitor are the same as or substantially similar to those of the method for forming a parallel capacitor described above, and will be referenced as such. In addition, embodiments of the method discussed above that are not inconsistent may be applied to the method for forming series capacitors as described herein. In general, a series capacitor may be formed by (a) forming a lower electrode pattern on an insulative substrate; (b) depositing a capacitor dielectric layer pattern on the lower electrode pattern; (c) forming a main upper electrode and a plurality of upper tuning electrodes on the capacitor dielectric layer pattern; and (d) printing one or more conductive features electrically connecting the main upper electrode to at least one of the upper tuning electrodes. A device including the series tunable capacitor (e.g., a wireless device, tag, EAS, RF, RFID, etc.) may be manufactured by forming an antenna and/or inductor on the series capacitor.

i. Forming the Main Lower Electrode Pattern

FIGS. 4A and 4B show cross-sectional and top-down views, respectively, of a substrate 405 having a lower electrode pattern formed thereon. As shown in FIG. 4B, the lower capacitor electrode pattern generally comprises a main lower electrode capacitor 410, and one or more lower tuning electrodes (e.g., structures 420-423). Although the embodiment of FIG. 4B includes four lower tuning electrodes, other variations may include additional (or fewer) tuning electrodes, as desired.

While the main lower electrode pattern can be formed on any type of substrate known in the art, in preferred embodiments, the substrate comprises an insulating and/or otherwise electrically inert material. For example, suitable substrates may include, but are not limited to glass (e.g., quartz) sheet, wafers, slips, plastic and/or metal foils or slabs, Si wafers, etc. Furthermore, the substrate may also include one or more additional layers (e.g., buffer, mechanical support, etc.). The substrate may be either stiff or flexible, as desired.

In embodiments comprising an electrically inert/inactive or insulative substrate, the material for the substrate may comprise a plate, disc, and/or sheet of a glass, ceramic, dielectric and/or plastic. In preferred embodiments, the substrate comprises or consists essentially of a polyimide, a glass/polymer laminate, or a high temperature polymer. Other suitable insulative substrates are discussed herein with regard to exemplary capacitors (see the section entitled "The Substrate" herein). In some embodiments glass and plastic substrates may further include a planarization layer thereon to reduce the surface roughness of the substrate. In addition, it may be advantageous to form a surface energy modifying layer of a material that improves the adhesion and/or that controls the spreading of a subsequent material (e.g., a liquid-based ink) printed or otherwise deposited thereon, and/or a barrier layer thereon.

If an electrically conductive substrate is chosen, it should have an insulator layer between the substrate and any electrically active layer or conductive structure formed thereon. However, the insulator layer is not needed in areas where an electrical contact will be made between the structures and/or devices on the insulator and a structure formed in the conductive substrate. If an insulator layer is required, the insulator layer may comprise a spin-on glass barrier layer having a thickness of from about 0.01 to about 10 µm (in one example, about 1 µm).

The lower capacitor electrode pattern (e.g., structures 410 and 420-423 of FIG. 4B) can be formed on the substrate 405 using any of the methods described herein for forming conductive structures, and can be formed using any of the conductive or semiconductive materials described with regard to the method for forming a parallel capacitor (see, e.g., the section above entitled "Forming the Main Upper Electrode and the Tuning Electrodes"). For example, referring to FIGS. 4A-4B, the first main lower electrode 410 and lower tuning electrodes 420-423 can be formed on the insulative substrate 405 in a predetermined pattern such that at least a portion of the underlying insulative substrate 405 is exposed. In exemplary embodiments, forming the main lower electrode pattern comprises depositing a conductive (or semiconductor) layer. Preferably, the conducting layer comprises or consists essentially of a conductive metal, a nitride, or a metal alloy.

Exemplary techniques for printing a liquid metal and/or metal or semiconductor precursor ink are described in U.S. Pat. Nos. 7,152,804, 7,879,696, 8,092,867, 8,158,518, and 7,314,513, and in U.S. patent application No. 11/203,563, filed on Aug. 11, 2005, the relevant portions of which are incorporated herein by reference. Additional formulations and/or methods of forming conductive structures (e.g., the main upper capacitor electrodes, the conductive feature, etc.) are discussed above with regard to the first exemplary method. The formulations and techniques described above are generally applicable to forming the lower capacitor electrode pattern of the second exemplary method to the extent that they are not inconsistent.

ii. Forming the Main Capacitor Dielectric Layer

Figure 4C:
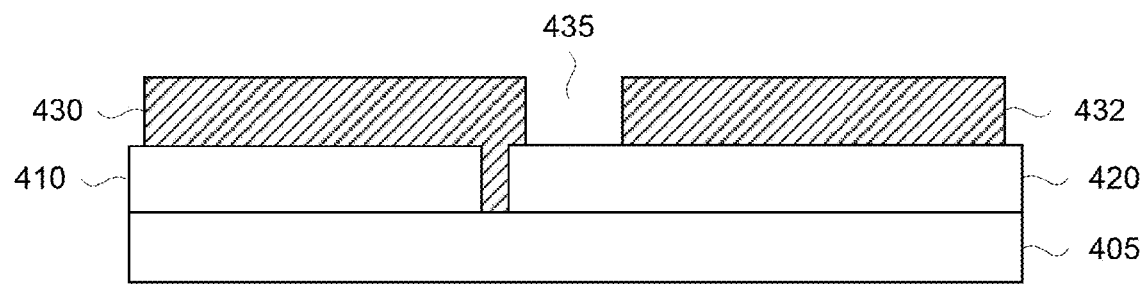
FIGS. 4C-4D show top-down and cross-sectional views, respectively, of another intermediate in the exemplary method for making series connected capacitors according to embodiments of the present invention.
Figure 4D:
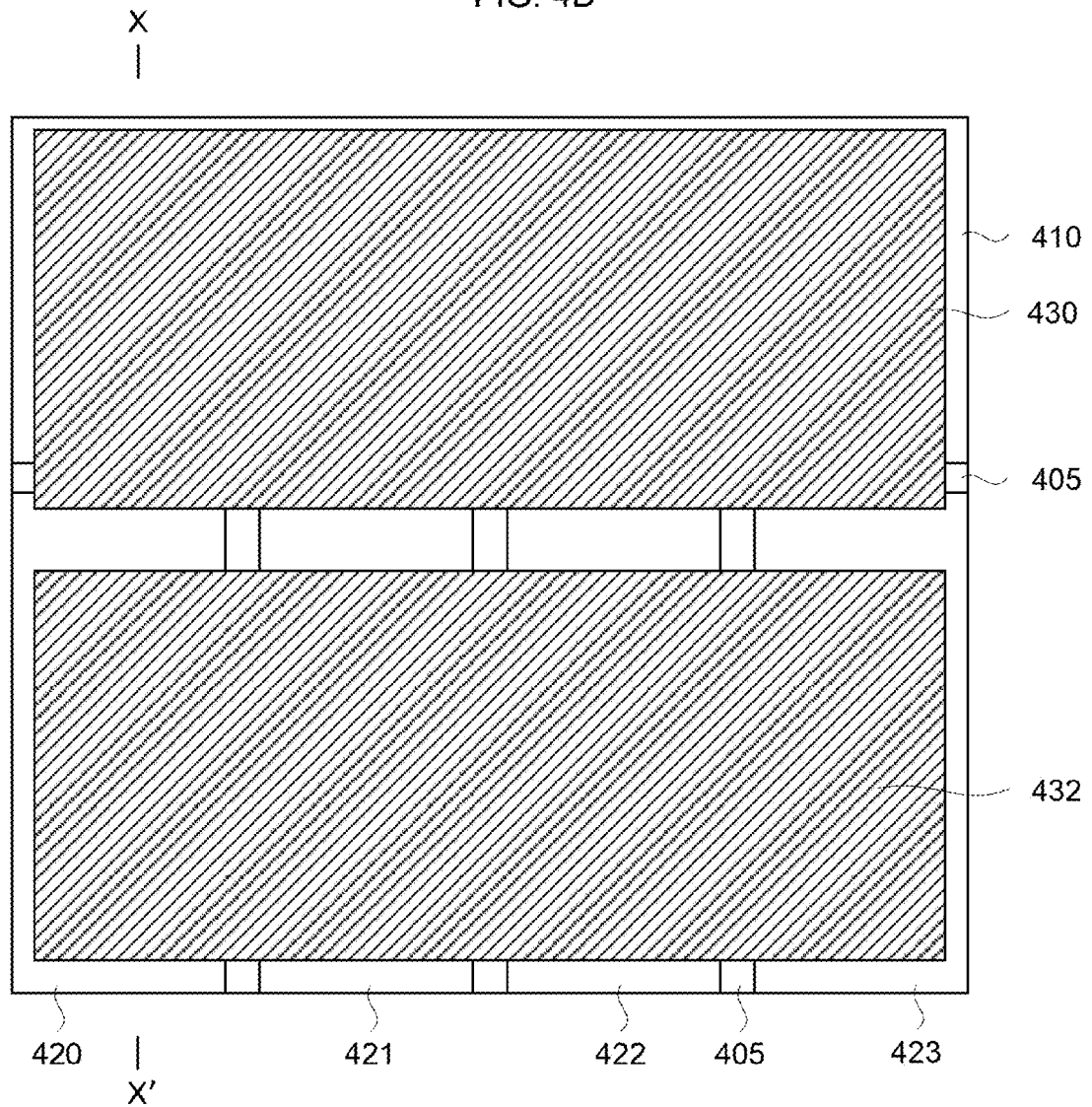

As shown in FIGS. 4C and 4D, a capacitor dielectric layer pattern 430/432 is formed on portions of the lower capacitor electrode pattern (410 and 420-423) and the substrate 405. In the embodiment of FIGS. 4C-4D, the capacitor dielectric layer pattern comprises a main capacitor dielectric layer 430 and a tuning capacitor dielectric layer 432. The capacitor dielectric layer pattern 430/432 can be formed using any of the methods, techniques, and/or materials, and with the same general characteristics as described herein with regard to forming dielectric layers in the first exemplary method (see the section entitled, "Forming the Main Capacitor Dielectric Layer"). Suitable materials for forming the main capacitor dielectric layer are described in detail below with regard to exemplary capacitors (see the section entitled, "Exemplary Dielectric Film Layers").

As shown in FIG. 4C, a portion of the dielectric layer (e.g., a portion of main capacitor dielectric layer 430) may be formed between the main lower capacitor electrode 410 and one or more lower tuning capacitor electrodes (e.g., tuning electrode 420). In alternate embodiments comprising a conductive substrate (not shown in FIGS. 4C and 4D), the capacitor dielectric layer pattern may be formed directly on the conductive substrate (metal foil, sheet, etc.). Preferably, the capacitor dielectric layer pattern 430/432 is selectively printed (e.g., ink jet, gravure, etc.) in a predetermined pattern on the substrate such that portions of the underlying capacitor electrodes (e.g., tuning electrode 420) are exposed (e.g., by contact hole/region 435 shown in FIG. 4C). To further illustrate, as shown in the top-down view in FIG. 4D, the main capacitor dielectric layer is generally patterned to expose portion of the main lower capacitor electrode 410, portions of the lower tuning electrodes 420-423, and portions of the substrate 405 as desired.

iii. Forming the Main Upper Electrode and Tuning Electrode(s)

Figure 4E:
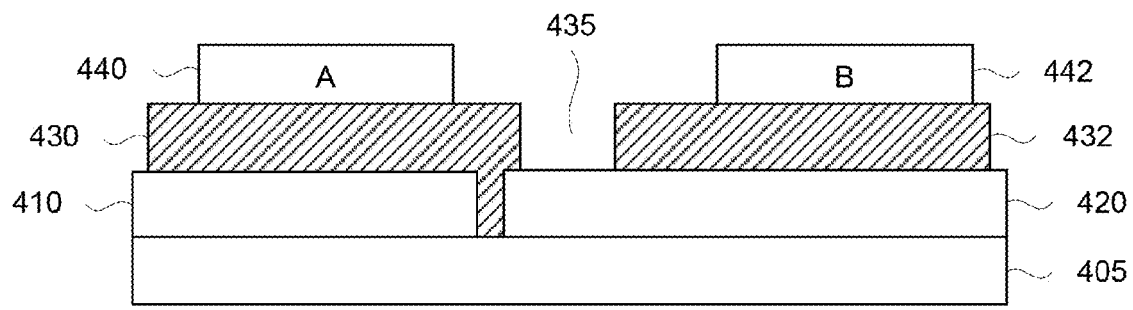
FIGS. 4E-4F show cross-sectional and top-down views, respectively, of another intermediate in the exemplary method for making series connected capacitors according to embodiments of the present invention.
Figure 4F:
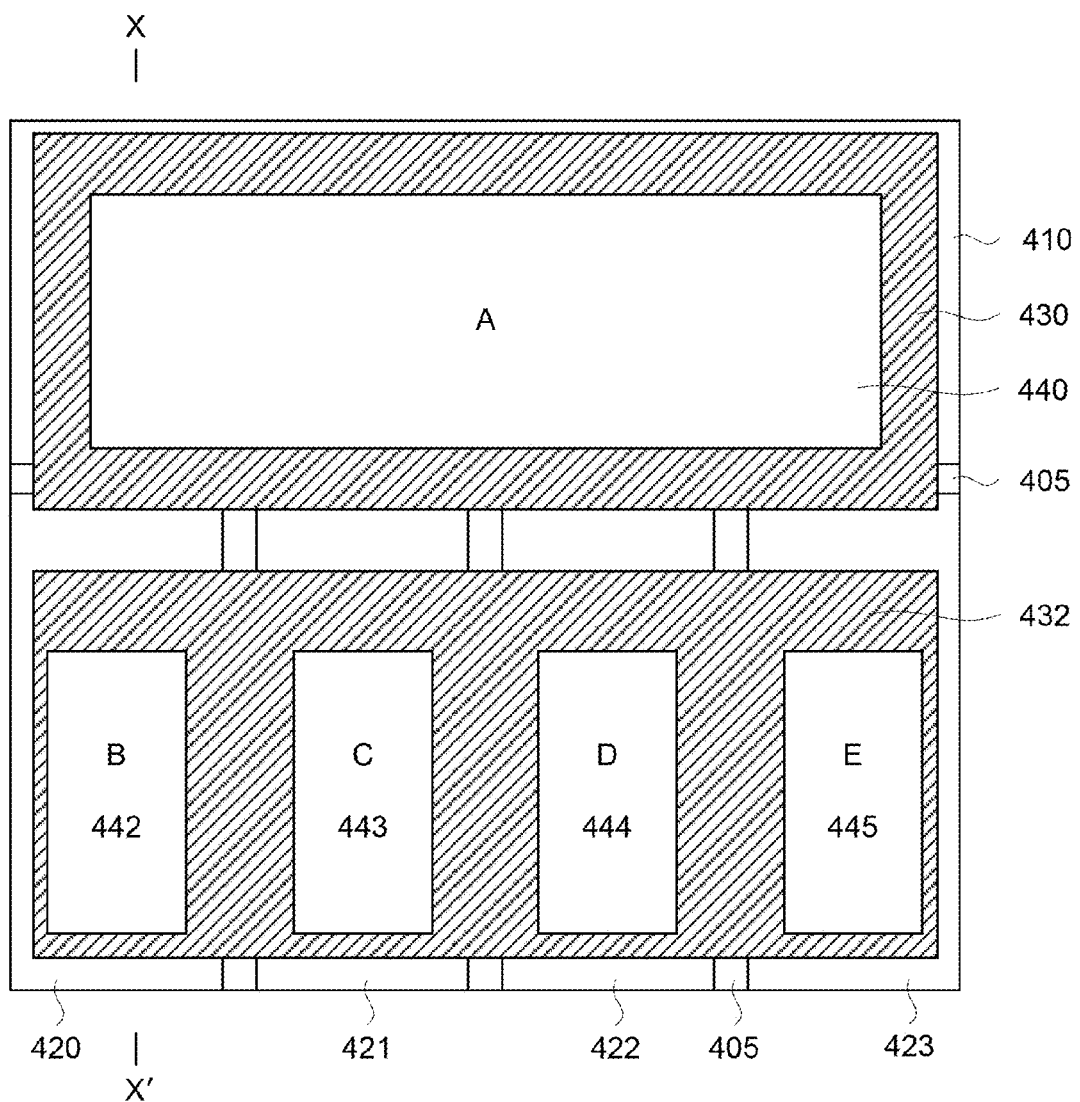

FIGS. 4E and 4F show cross-sectional and top-down views, respectively, of the device after a main upper capacitor electrode 440 and one or more upper tuning capacitor electrodes (e.g., structures 442-445) have been formed on the dielectric layer pattern 430/432. In general, the main upper electrode 440 is capacitively coupled to the main lower electrode 410 to form capacitor A. Similarly, upper tuning electrodes 442, 443, 444, and 445 are capacitively coupled to lower tuning electrodes 420, 421, 422, and 423, respectively to form capacitors B, C, D, and E, respectively. The main upper capacitor electrode 440 and the upper tuning electrodes 442-445 may be formed using any of the deposition formulations, methods and/or techniques discussed herein with regard to forming conductive (or semiconductor) structures and/or layers. In some embodiments, the main upper electrode 440 and/or the upper tuning electrode(s) 442-445 may be formed from the same (semi)conductive material used to form the lower capacitor electrode pattern 410 and 420-423, or in the alternative, the conductive structures (e.g., main upper and lower capacitor electrodes and the upper/lower tuning electrodes) may each be formed using different (semi) conductive materials.

iv. Forming the Conductive Feature or Strap

One or more conductive features or straps are formed on the device and electrically connect the main upper electrode to at least one of the tuning electrodes as shown in FIGS. 4G-4L. Specifically, FIG. 4H shows a top-down view of the present capacitor with one conductive strap or feature 450 formed thereon connecting the main capacitor electrode 440 (corresponding to capacitor A) to tuning capacitor electrode 442 (corresponding to capacitor B) in series. FIG. 4G shows a cross-sectional view of FIG. 4H along the X-X' axis. In this embodiment, the conductive strap 450 is formed in electrical contact with the main upper capacitor electrode 440 and lower tuning capacitor 420 (e.g., through the contact opening formed in the capacitor dielectric pattern (e.g., contact hole 435 in FIG. 4E).

Figure 4I:
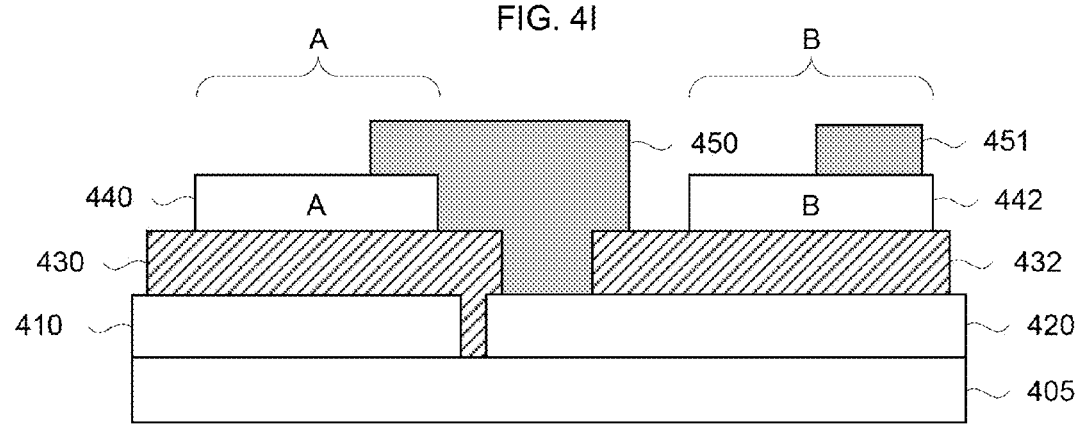
FIGS. 4I-4J show cross-sectional and top-down views, respectively, of the capacitor of FIGS. 4G-4H having a second conductive feature formed thereon connecting additional tuning capacitors in series.
Figure 4J:
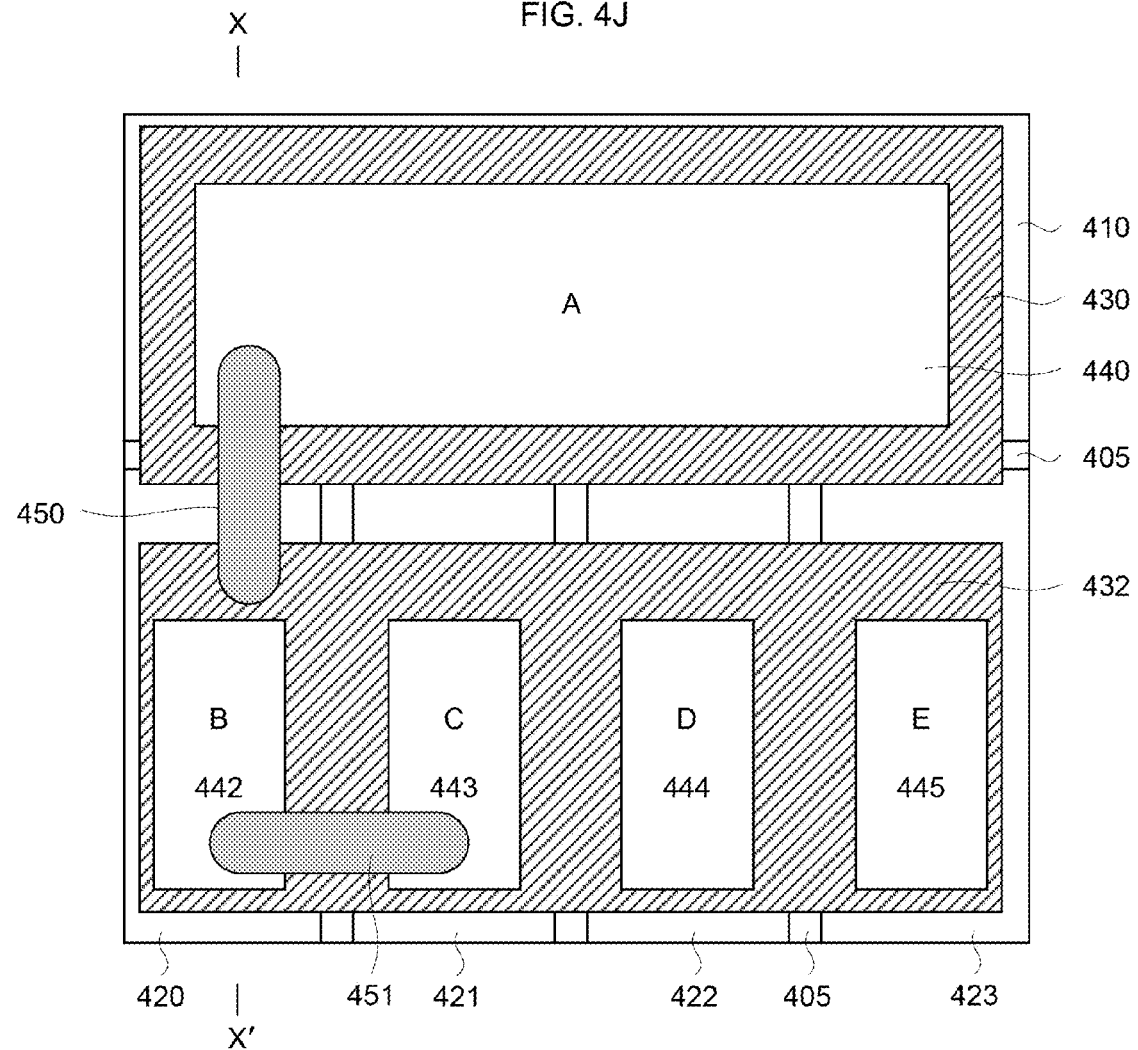

As shown in FIGS. 4I-4L, additional tuning capacitors can be connected to the circuit by forming additional conductive features on the device. For example, FIG. 4J shows a top-down view of the device of FIGS. 4G-4H with a second conductive feature 451 formed thereon. FIG. 4I shows a cross-sectional view of the FIG. 4J along the X-X' axis. The second conductive feature 451 electrically connects upper tuning electrode 442 and upper tuning electrode 443 (corresponding to capacitors B and C, respectively), in series, and thus the net capacitance is decreased.

FIG. 4L shows a top-down view of FIGS. 4I-4J with a third conductive feature 452 formed thereon. FIG. 4K shows a cross-sectional view of FIG. 4L along the Y-Y' axis. In this embodiment, the third conductive feature 452 electrically connects lower tuning capacitor 421 to lower tuning capacitor 422 (corresponding to capacitors C and D, respectively) in series, further decreasing the overall capacitance of the circuit. Although not shown in the figures, additional tuning capacitors can be similarly connected as desired to further reduce the net capacitance of the circuit.

In general, the conductive feature(s) or strap(s) (e.g., 450, 451, and 452, etc.) can be formed using any of the materials, formulations, methods and/or processes previously described herein with regard to making conductive structures. In exemplary embodiments, the conductive feature or strap may be digitally printed in a predetermined pattern. In other preferred embodiments, the conductive feature or strap is formed from a conducting layer selected from the group consisting of a conductive metal, a conductive nitride, or a metal alloy.

v. Forming the Antenna and/or Inductor

According to embodiments of the present method, an antenna and/or inductor may be formed on the device and coupled with, or electrically connected to, an upper tuning capacitor electrode and the main lower capacitor electrode to form a device (e.g., wireless, surveillance and/or identification tag, RF, RFID, EAS, UHF, etc.). The antenna and/or inductor may comprise the antenna, the inductor, or both. The antenna and/or inductor can be formed using any of the materials, methods, and/or procedures previously discussed with regard to forming an antenna and/or inductor (or other conductive structures) with regard to the exemplary method for forming parallel capacitors to the extent that they are not contradictory.

Figure 5A:
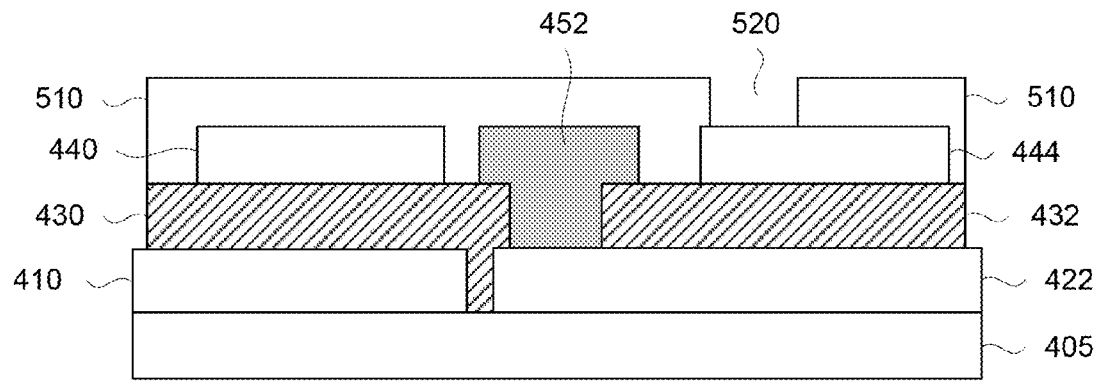
FIGS. 5A-5B show cross-sectional and top-down views, respectively, of an intermediate in the exemplary method for making a device with capacitors connected in series, according to embodiments of the present invention.
Figure 5B:
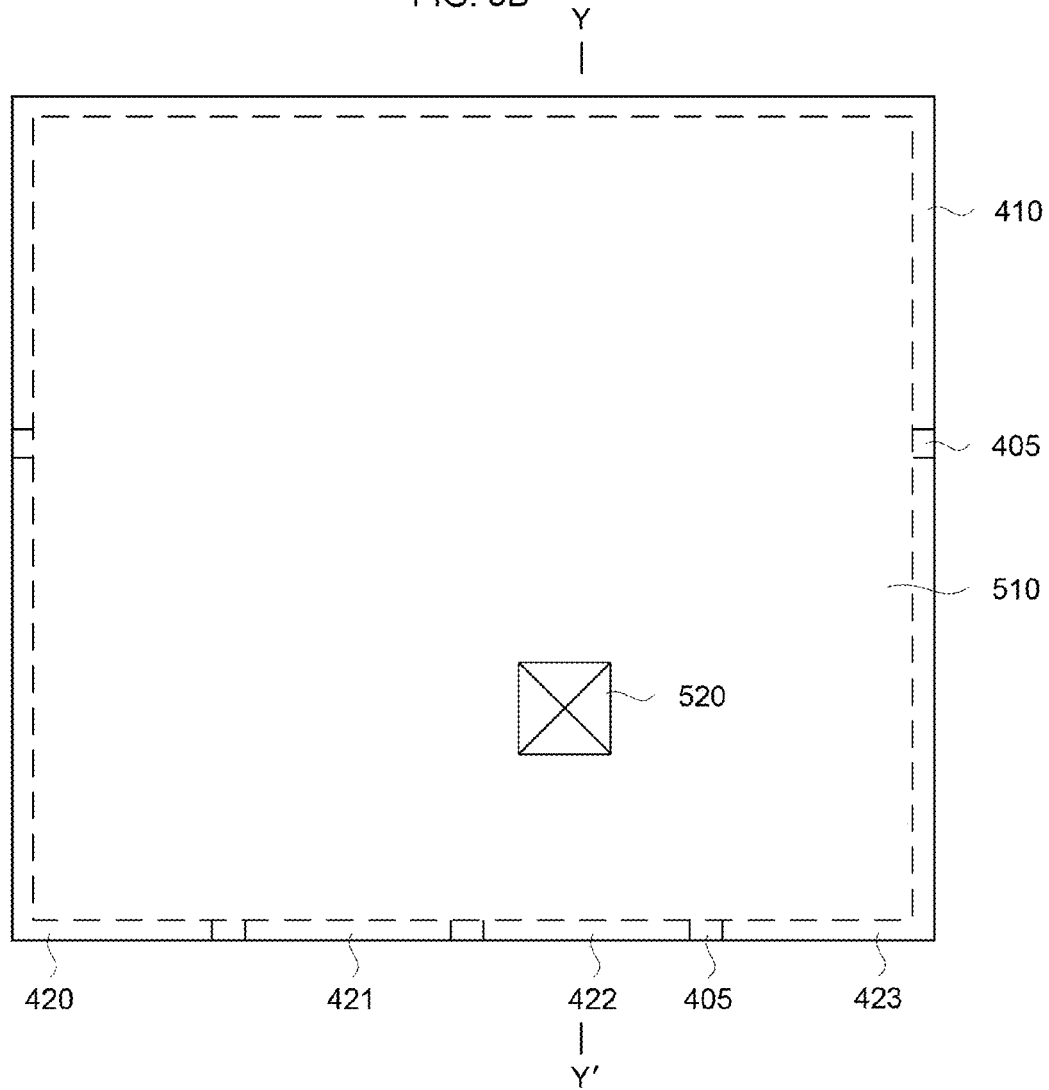

As shown in FIGS. 5A and 5B (cross-sectional and top-down views, respectively), before forming the antenna/inductor on the capacitor of FIGS. 4K-4L, a dielectric layer 510 (e.g., interlayer dielectric) may be formed on at least portions of the substrate, including but not limited to, the main upper capacitor electrode 440, the upper tuning electrodes (e.g., 442-445), the conductive features (e.g., 450-452), and the capacitor dielectric layer pattern (430 and 432). The interlayer dielectric 510 may have one or more contact holes (e.g., 520) formed therein to expose a portion of one or more of the upper tuning electrodes (e.g., 444) and/or the main lower capacitor electrode 410. In addition, the interlayer dielectric 510 may be selectively formed (e.g., by printing process described herein) such that desired and/or predetermined portions of the upper tuning electrodes and/or the main lower electrode are exposed. The dielectric layer 510 may be formed using any of the materials and/or methods previously discussed herein with regard to forming dielectric layers to the extent they are not inconsistent.

Figure 5C:
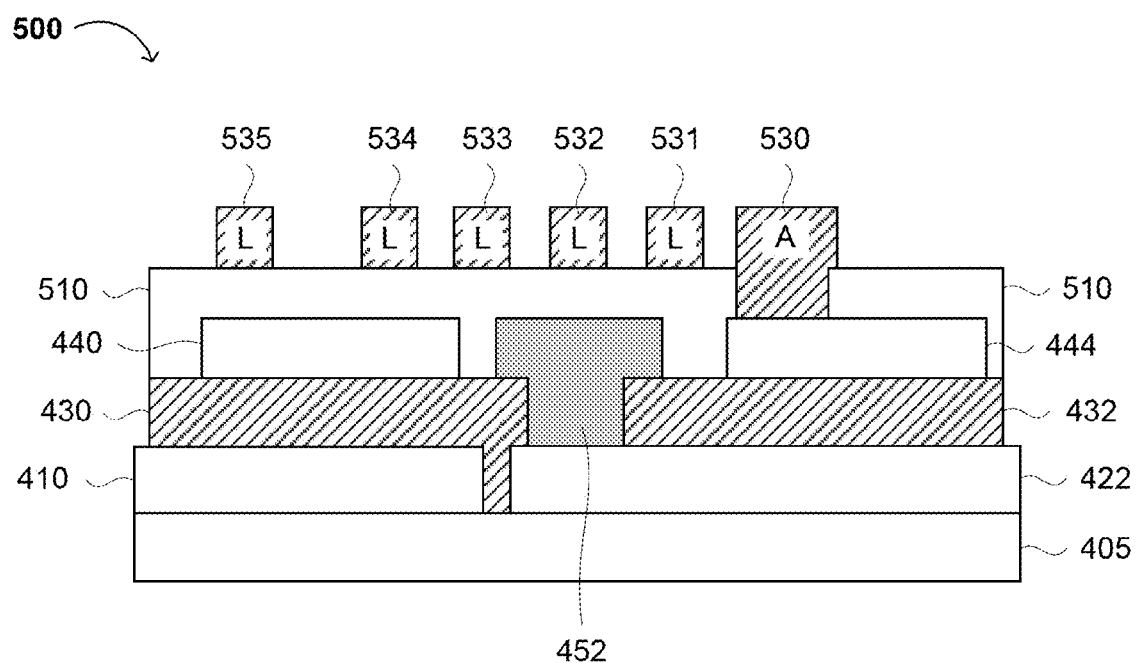
FIGS. 5C-5D show cross-sectional and top-down views, respectively, of an exemplary device with capacitors connected in series, according to embodiments of the present invention.
Figure 5D:
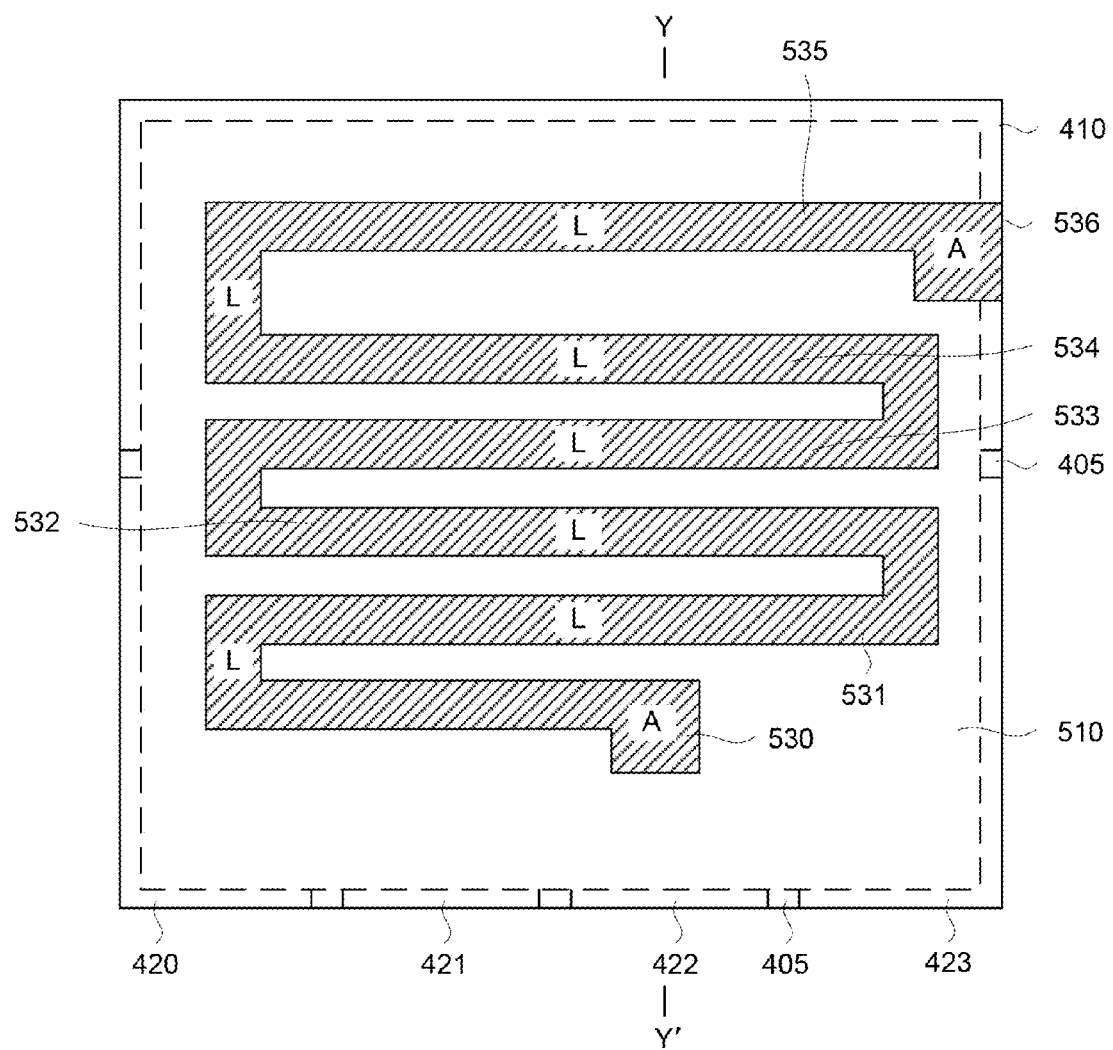

FIG. 5D shows a top-down view of the device of FIG. 5B with an antenna and/or inductor formed thereon. FIG. 5C shows a cross-sectional view of FIG. 5D along the Y-Y' axis. As shown in FIGS. 5C and 5D, the antenna/inductor is formed on the structure and electrically connects at least one upper tuning capacitor electrode 444 and the main lower capacitor electrode 410. The antenna/inductor may be formed with any shape and size suitable for placement on the tag or device, and can be made using any of the conductive materials described herein. For example, in the exemplary embodiment shown in FIGS. 5C-5D, the antenna and/or inductor is formed having a zig-zag pattern, or serpentine shape. However, the invention is not limited as such, and the inductor/antenna may have any other shape discussed herein that will fit on the tag/device. The antenna/inductor may be formed with a thickness of from 1 to 100 μm and a resistivity of from 0.1 to 100 μohm-cm (or any range of values therein), as desired.

vi. Passivation

Although not shown in the device 500 of FIGS. 5C-5D, in some variations, a passivation layer may be formed over the structures on the substrate (e.g., the antenna/inductor, the interlayer dielectric film, the capacitor electrodes, the conductive feature, etc.). Forming a passivation layer may inhibit or prevent the ingress of water, oxygen, and/or other species that might cause degradation or failure of the integrated circuitry/device. Suitable materials for forming the passivation layer, as well as exemplary characteristics (e.g., length, width, thickness, etc.) are described in detail with regard to exemplary tunable capacitors (see, e.g., the section entitled, "The Passivation Layer" herein). The passivation layer may be formed using any of the methods described herein with regard to the first exemplary method.

Exemplary Tunable Capacitors

A second aspect of the present invention relates to tunable capacitors, and devices including tunable capacitors. Exemplary capacitors and devices are described herein, along with a detailed discussion regarding the various components that may be included in such capacitors and/or devices.

FIGS. 1E and 1F show cross-sectional and top-down views, respectively of a first exemplary capacitor 100 connected in parallel. In general, the first exemplary capacitor

100 comprises (a) a main capacitor dielectric layer 120 on a substrate 110; (b) a main upper electrode 130 and at least one tuning electrode 132 on the main dielectric layer 120; and (c) one or more printed conducting features 140 (e.g., straps) electrically connecting the main upper electrode 130 to the tuning electrode(s) (e.g., 132). In exemplary embodiments, the substrate 110 comprises a conductive material and may serve as a shared lower capacitor electrode. The main upper capacitor electrode 130 is capacitively coupled to the lower electrode (e.g., conductive substrate 110) to form capacitor A, and the upper tuning capacitor electrode 132 is capacitively coupled to the lower electrode/conductive substrate 110 to form capacitor B. The conductive feature 140 connects capacitors A and B in parallel. The capacitor may include a plurality of tuning capacitors, which may have a variety of sizes. Varying the size of the tuning capacitor electrodes allows various combinations to be connected together (see, e.g., FIGS. 1I-1J) to obtain high precision capacitors with relatively small granularity, which results in high precision and/or improved matching of capacitance values. Other possible variations are discussed in detail below (see the sections entitled "The Capacitor Electrodes" and "The Conductive Feature or Strap").

Figure 2:
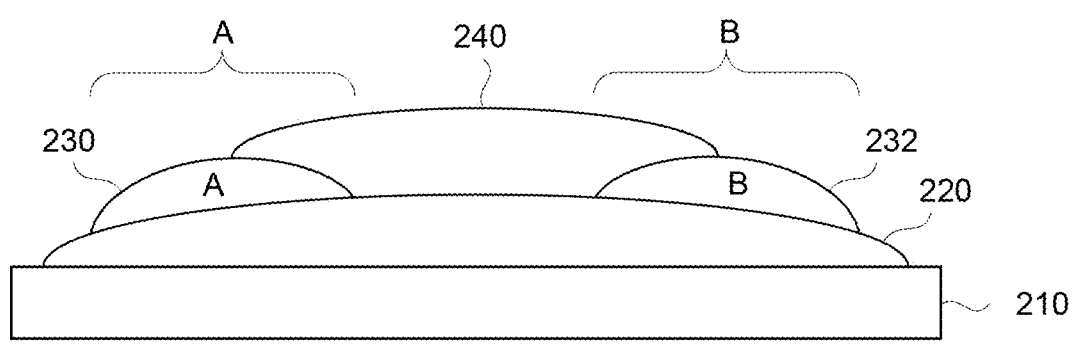
FIG. 2 shows a cross-sectional view of the capacitor of FIG. 1E with structures having a dome-shaped profile.

In some exemplary embodiments, the various structures of the capacitor may have a dome-shaped profile. For example, as shown in FIG. 2, the capacitor dielectric 220, the main capacitor electrode 230, the tuning capacitor electrode 232, and/or the conductive feature 240 may have a dome-shaped profile. Structures and devices having a dome-shaped profile, and methods of forming such structures and devices are described in detail in co-pending U.S. patent application Ser. No. 12/243,880, filed on Oct. 1, 2008, the relevant portions of which are incorporated herein by reference.

The parallel capacitor (e.g., as shown in FIGS. 1E-1F and 2) can be used in a device 300, as shown in FIGS. 3A-3B (cross-sectional and top-down views, respectively). As shown in FIG. 3A, a second dielectric layer or film 350 is formed over at least a part of main upper capacitor electrode 130 and tuning electrode 132, conductive feature/strap 140, and the main capacitor dielectric film 120. An antenna 360-363 is on the second dielectric layer 350, and contacts the conductive feature 140 and the conductive substrate 110 (i.e., serving as the main lower capacitor electrode). Although not shown in FIG. 3A, the structure may optionally further comprise a passivation layer on the substrate. The devices of the present invention may comprise a wireless device, a surveillance and/or identification tag or device, EAS, RF, RFID, HF, VHF, and/or UHF tag or device, etc.

FIGS. 4K and 4L show cross-sectional and top-down views, respectively of an exemplary series tunable capacitor 400 generally comprising (a) an insulative substrate 405; (b) a lower electrode pattern thereon, the lower electrode pattern comprising a main lower electrode 410 and at least one lower tuning electrode 422; (c) a capacitor dielectric layer pattern 430-432 on the lower electrode pattern; (d) a main upper electrode 440 and a plurality of tuning electrodes 442-445 on the capacitor dielectric layer pattern; and (e) one or more printed conductive features 450-452 electrically connecting the main upper electrode to at least one of the tuning electrodes.

FIGS. 5C-5D show cross-sectional and top-down views, respectively of a device 500 including the exemplary series capacitor 400. Specifically, the device comprises a second dielectric layer 510 on the capacitor 400 of FIGS. 4K-4L, and an antenna and/or inductor 530-535 electrically connected to the lower main capacitor electrode 410 and an upper tuning electrode 444.

Various structures and components of the exemplary capacitors and/or devices of the present invention are described in detail below, and are generally applicable to both series and parallel capacitors.

i. The Substrate

In general, suitable substrates for the capacitors of the present invention may comprise any insulating, conductive, or semiconductive material known in the art. For example, the substrate may comprise a wafer, plate, disc, sheet and/or foil of a semiconductor (e.g. silicon), a glass, a ceramic, a dielectric, plastic and/or a metal, preferably a member selected from the group consisting of a silicon wafer, a glass plate, a ceramic plate or disc, a plastic sheet or disc, metal foil, a metal sheet or disc, and laminated or layered combinations thereof. In some variations, the substrate may comprise a multi-layer structure, including a metal or other conductive material with a corresponding oxide or blanket deposited/coated insulator thereon. Optionally, the substrate may comprise a backing layer on the metal layer, which may comprise the same material as the insulating layer (see, e.g., co-pending U.S. patent application Ser. No. 12/467,121, filed on May 15, 2009, the relevant portions of which are incorporated herein by reference). In some exemplary embodiments, substrate comprises aluminum or stainless steel foil with $SiO_2$ deposited or coated thereon. In other exemplary embodiments, the metal substrate may comprise aluminum foil with anodized $Al_2O_3$ thereon. However, the preferred substrate may depend on which of the above-described methods will be used to make the device.

Embodiments including a parallel capacitor (manufactured according to the first exemplary method, and corresponding to FIGS. 1E-1I) preferably comprise a conductive structure or substrate (e.g., a metallic substrate, metal film, metal foil, metal sheet, etc.). In some implementations, the substrate comprises or consists essentially of a metal such as aluminum, titanium, copper, silver, chromium, molybdenum, tungsten, nickel, gold, palladium, platinum, zinc, iron, steel (e.g., stainless steel) or an alloy thereof. In exemplary embodiments, the conductive substrate also serves as the main lower capacitor electrode.

In various embodiments, other conductive materials may be used including conductive polymers, conductive inorganic compound films, and/or doped semiconductors. In various embodiments, the metal or alloy used for the conductive substrate may comprise a multi-layer structure, such as aluminum, tantalum or zirconium deposited (e.g., by sputtering or CVD) onto a thin copper sheet or foil, or copper deposited (e.g., by electroplating) onto a thin aluminum sheet or foil. However, in preferred embodiments, the conductive substrate is a metal foil comprising or consisting essentially of stainless steel, molybdenum, copper, or aluminum. In some embodiments, the metal for the conductive substrate may be chosen at least in part based on its ability to be anodized to form an effective capacitor dielectric film.

In exemplary embodiments, the conductive (e.g., metal) substrate has a thickness of from about 1 μm to about 300 μm (e.g., 5-200 μm, 20-100 μm, or any range of therein). Furthermore, the substrate may have a resistivity of from about 0.1 μohm-cm to about 100 μohm-cm (e.g., 0.1-10 μohm-cm, 0.5-5 μohm-cm, 3 μohm-cm, or any other range therein). In exemplary embodiments, the resistivity is about 0.5 to about 80 μohm-cm.

Embodiments including a series capacitor (manufactured according to the second exemplary method, and corresponding to FIGS. 4K-4L) may have a substrate comprising any type of suitable substrate material known in the art and as described herein (e.g., glass sheets, wafers, slips, plastic, and/or metal foils or slabs, Si wafers, etc). However, preferably, the substrate comprises an insulating and/or otherwise electrically inert material. For example, suitable electrically inert or inactive substrates may comprise a plate, disc, and/or sheet of a glass (e.g., quartz), ceramic, dielectric and/or plastic. In some preferred embodiments, the insulating substrate is selected from the group consisting of a polyimide, a polyether sulfone, a polyethylene naphthalate [PEN], a polyethyleneterephthalate [PET], a glass/polymer laminate, or a high temperature polymer. In variations comprising an electrically conductive substrate (e.g., metal foil, or any of the conductive substrates described herein), the substrate should further comprise an insulator layer between the substrate and any electrically active structures subsequently form thereon (e.g., the lower capacitor electrode pattern, etc.). For example, such insulator layers may comprise a spin-on glass barrier layer having a thickness of about 1 µm. Some embodiments include a glass and/or plastic substrate, which may further comprise a planarization layer thereon to reduce the surface roughness of the substrate.

ii. The Capacitor Electrodes

In general, the capacitor electrodes (e.g., the main lower and upper capacitor electrodes and/or the tuning electrodes) may comprise any conductive or semiconductive material known in the art. For example, in some preferred embodiments, the capacitor electrodes comprise a conducting layer (e.g., a conducting metal, nitride, or a metal alloy). In exemplary embodiments, the main upper and lower electrodes and/or the tuning electrodes further comprise a printed metal, conductor, or semiconductor precursor ink as described in detail herein with regard to the first and second methods for making a capacitor.

Referring first to exemplary parallel tunable capacitors (shown in FIGS. 1E-1I), the main lower capacitor electrode 110 is preferably formed from the conductive substrate, and thus may comprise any conductive material discussed herein with regard to conductive substrates and/or materials (e.g., aluminum, titanium, etc.). Referring now to exemplary series capacitors (shown in FIGS. 4K-4L), a lower electrode pattern, including the main lower capacitor electrode 410 and one or more lower tuning electrodes (e.g., 420-423), is on the (insulative) substrate 405, and may comprise any suitable conductive material described herein (e.g., metal/conductor ink, metal precursor ink, seed/bulk metal, semiconductor ink, etc.). In exemplary embodiments, the capacitors include a conducting layer comprising a conductive metal, a nitride, or a metal alloy. Suitable conductive materials (e.g., metal precursor inks, semiconductor inks, etc.) are described in detail in U.S. Pat. Nos. 7,553,545, 7,422,708, 7,294,449, 7,485,691, 7,491,782, 7,314,513, 7,498,317, 7,879,696, 7,687,327, 7,701,011, 7,767,520, 8,092,867, and 8,066,805 the relevant portions of which are incorporated herein by reference.

In some implementations, a printed metal layer (e.g., Pd) can serve as a seed layer for electroless deposition or electroplating of other bulk conductive metals. Metal inks suitable for forming a seed layer, bulk conductive metals, and methods of forming structures from the same are described in U.S. Pat. Nos. 8,066,805 and 8,158,518, the relevant portions of which are incorporated herein by reference.

In exemplary embodiments, the lower capacitor electrodes may have a nominal thickness of from 1 to 2,000 µm (e.g., from 50 to 2,000, 200 to 1,000 µm, 1 to 300 µm, 5 to 200 82 m, 20 to 100 µm, or any other range of values therein) and/or a resistivity of 0.1-100 µohm-cm (e.g., from 0.5 to 80 µohm-cm, 0.5 to 5 µohm-cm, or any other range of values therein, and in one embodiment, about 3 µohm-cm.

In embodiments where the main lower electrode is formed on the substrate (e.g., the series capacitor shown in FIGS. 4K-4L), lower electrodes may be formed on the substrate in a predetermined pattern (e.g., main lower electrode 410 and tuning electrodes 420-423), in accordance with design choices and/or preferences. The main lower capacitor electrode may have any desired shape, such as round, square, rectangular, triangular, etc., and with nearly any dimensions (e.g., that allow the capacitor to fit in and/or on a device, etc.). Preferably, the main lower capacitor electrode has dimensions of (i) width, length and thickness, or (ii) radius and thickness, in which the thickness is substantially less than the other dimension(s). For example, the main lower capacitor electrode may have a radius of from 25 to 10,000 µm (preferably 50 to 5,000 µm, 100 to 2,500 µm, or any range of values therein), or a width and/or length of 50 to 20,000 µm, 100 to 10,000 µm, 250 to 5,000 µm, or any range of values therein.

Similarly, the main upper capacitor electrode may also have any desired shape, such as round, square, rectangular, triangular, etc., and with nearly any dimensions. In some embodiments (e.g., as shown in FIG. 2), the main upper capacitor electrode 230 may have a dome-shaped profile. In general, the main upper capacitor electrode (e.g., 130 in FIGS. 1E-1F and/or 440 in FIGS. 4K-4L) has dimensions of (i) width, length and thickness, or (ii) radius and thickness, in which the thickness is substantially less than the other dimension(s). For example, the main upper capacitor electrode 130 and/or 440 may have a radius of from 20 to 10,000 µm (preferably 40 to 5,000 µm, 80 to 2,500 µm, or any range of values therein), or a width and/or length of 40 to 20,000 µm, 80 to 10,000 µm, 150 to 5,000 µm, or any range of values therein.

The upper tuning electrodes (e.g., 132, 134, 136, and 138 of FIG. 1G and 442-445 of FIG. 4L) may be selectively formed in a predetermined pattern to have any desired size or shape. Each tuning electrode can be individually formed using the same or different (semi)conductive material, and each tuning electrode can be individually formed to have a unique size and/or shape. For example, as shown in FIG. 1H, tuning electrodes 135 and 137 are smaller than tuning electrodes 132 and 138, and tuning electrode 135 is smaller than tuning electrode 137. However, the invention is not limited as such, and other combinations of tuning electrode shapes and sizes are possible.

The tuning electrodes are connected (e.g., to the main upper capacitor electrode and/or other tuning electrodes) by a conductive feature to achieve a predetermined total capacitance. For example, tuning electrodes can be added and connected to the circuit in parallel or in series to increase or decrease the net capacitance as desired. For example, as shown in FIG. 1G, capacitors A and B are connected by conductive feature 140. To increase the overall capacitance, an additional tuning capacitor (e.g., structure 138 corresponding to capacitor E) can be connected to capacitor A by conductive feature 142 in parallel, as shown in FIG. 1H. Additional capacitors can be connected to the circuit as desired to increase capacitance, as shown in FIG. 1J (e.g., capacitor G is connected to capacitor A by conductive feature 144).

In alternative embodiments, tuning electrodes can be added or connected to the circuit in series to decrease the overall capacitance. For example, in FIG. 4H, capacitors A and B are connected by conductive feature 450 in series. To decrease the net capacitance, additional tuning capacitors can be connected as shown in FIG. 4J, where capacitors B and C are connected in series by feature 451, and in FIG. 4L, where capacitors C and D are also connected in series (e.g., by feature 452).

In some exemplary embodiments, at least one of the capacitor electrodes (e.g., main upper capacitor electrode, main lower capacitor electrode, tuning electrodes, etc.) has a dome-shaped profile. For example, as shown in FIG. 2, the main upper electrode 230 and tuning electrode 232 have a dome-shaped profile. Structures having dome-shaped profiles and various methods of forming such structures are described in co-pending U.S. patent application Ser. Nos. 12/114,741 and 12/243,880, respectively), respectively filed on May 2, 2008 and Oct. 1, 2008, the relevant portions of which are incorporated herein by reference.

iii. Exemplary Dielectric Film Layers

The capacitors of the present invention generally include one or more dielectric film layers. For example, the parallel and series capacitors each include a main capacitor dielectric film (e.g., structure 120 of FIGS. 1E-1G and structures 430/432 of FIGS. 4K-4L) between the lower capacitor electrodes and the upper capacitor electrodes. When the capacitors are used in a tag or device, as shown in FIGS. 3A-3B and/or FIGS. 5A-5D, there may also be an additional/second dielectric layer film (e.g., an interlayer dielectric film) 350 in FIGS. 3A-3B and/or 510 in FIGS. 5A-5D on at least parts of the upper capacitor electrodes, conductive feature(s), and/or the main capacitor dielectric film. In exemplary embodiments, the dielectric film(s) may have a dome-shaped profile (see, e.g., the main capacitor dielectric film 220 of FIG. 2).

In general, the dielectric film(s) of the present invention may comprise any electrically insulative dielectric material, such as a metal or silicon oxide and/or nitride, or other ceramic or glass (e.g., silicon dioxide, silicon nitride, aluminum oxide, etc.). In some exemplary embodiments, the dielectric film(s) comprises or consists essentially of aluminum oxide, silicon dioxide, and/or a corresponding oxide or nitride of the metal used to manufacture the conductive structures (e.g., the main lower capacitor electrode, the conductive substrate, the main upper capacitor electrode or tuning electrodes, etc). In some variations, the dielectric may further comprise an additional metal oxide layer on the dielectric film. Thus, in some implementations, the capacitor dielectric film(s) may comprise a plurality of layers.

In some embodiments, the dielectric film(s) may comprise an inorganic insulator. For example, in some preferred embodiments, the inorganic insulator comprises or consists essentially of $SiO_2$, $Al_2O_3$, $Si_3N_4$, a silicon oxynitride, $TiO_2$, or $HfO_2$. In other embodiments, the dielectric film comprises an organic dielectric material, which may comprise or consist essentially of a polyimide, a polyether sulfone, a polyethylene naphthalate [PEN], a polyethyleneterephthalate [PET], or a polyether ether ketone [PEEK]. Other suitable materials for the dielectric film(s) are described in detail in U.S. Patent Nos. 7,767,520, 7,701,011, and 7,709,307 and U.S. Pat. Application Nos. 11/818,078, 12/249,735, 12/467,121 respectively filed on Jun. 12, 2007, Oct. 10, 2008, and May 15, 2009, the relevant portions of which are incorporated herein by reference.

In some implementations, one or more of the dielectric films of the present invention has at least one contact hole therein. For example, as shown in FIG. 4C, the main capacitor dielectric film 430/432 has a contact hole 435 therein exposing a portion of the underlying electrode (e.g., tuning electrode 420). Referring now to the device 300 of FIG. 3A, the (second) interlayer dielectric film 350 may have one or more contact holes therein to expose the conductive substrate 110 and/or the conductive feature 140 to facilitate electrical connection with the antenna/inductor 362-363.

In exemplary embodiments, the main capacitor dielectric layer has a thickness of from 20 Å to 2 µm (e.g., 20 Å to 1,000 Å, 1,000 Å to 2 µm, 50 to 50 Å, or any other range of values therein). When the tunable capacitor is used in a device, the main capacitor dielectric film preferably is designed and made to have sufficient thickness and/or breakdown voltage such that application of a deactivating radio frequency electromagnetic field induces a voltage differential in the capacitor across the dielectric layer that will deactivate the tag/device (e.g., a voltage differential of about 4 to about 50 V, preferably about 5 to less than 30 V, more preferably about 10 to 20 V, or any other range of endpoints therein) through breakdown of the dielectric layer to shorted state or changed capacitance such that the tag circuit no longer resonates at the desired frequency. Thus, in such embodiments, the main capacitor dielectric film has a thickness of from about 50 to about 400 Å, and/or a breakdown voltage of from about 10 to about 20 V.

Referring now to the device shown in FIGS. 3A-3B, in some variations, the main capacitor dielectric film 120 has significantly smaller thickness than the thickness of the second (interlayer) dielectric film 350. For example, in one exemplary embodiment the main capacitor dielectric film 120 may have a thickness of from 20 to 1,000 Å, and the second (interlayer) dielectric film 350 may have a thickness of from 2,000 to 20,000 Å. In exemplary embodiments, the interlayer dielectric film 350 has a thickness of from 3,000 to 5,000 Å.

iv. The Conductive Feature or Strap

The capacitors of the present invention comprise at least one conductive feature or strap to connect the upper capacitor electrode(s) to one or more tuning capacitor electrodes. In general, the conductive feature/strap may comprise any electrically (semi)conductive material described herein with regard to conductive structures. In some exemplary embodiments, the strap is a conducting layer comprising or consisting essentially of a conductive metal, a nitride, or a metal alloy.

Referring now to FIGS. 1E-1F (cross-sectional and top-down views, respectively), in exemplary parallel capacitors, the conductive strap 140 connects main upper capacitor electrode 130 and tuning capacitor electrode 132 (corresponding to capacitors A and B, respectively). As shown in FIG. 1E, the strap 140 is on at least a portion of the main capacitor electrode 130, the main capacitor dielectric film 120, and tuning capacitor electrode 132. In this embodiment, capacitors A and B are connected in parallel, thus the overall capacitance of the device is increased.

FIGS. 4G-4H show cross-sectional and top-down views, respectively, of an exemplary series capacitor having a conductive feature 450 connecting the upper main capacitor electrode 440 and lower tuning electrode 420 (corresponding to capacitors A and B) in series. As described with regard to exemplary parallel capacitors, the series capacitor may comprise additional conductive features connecting other tuning capacitors to achieve the desired net capacitance. For example, as shown in FIGS. 4I-4J, a second conductive feature 451 connects upper tuning electrode 442 and upper tuning electrode 443 (corresponding to capacitors B and C) in series, and the net capacitance of the device is decreased. To further illustrate, as shown in FIGS. 4K-4L, a third conductive feature 452 connects lower tuning electrodes 421 and 422 (corresponding to capacitors C and D) in series. Additional conductive features may be added in series to further decrease the net capacitance.

The conductive feature/strap may have any suitable shape and size (e.g., square, rectangular, round, regular or irregular, etc.), as shown in FIGS. 1F-1J. In addition, a plurality of conductive straps can be formed to achieve a predetermined or desired overall capacitance. For example, in the embodiment of FIGS. 1F and 1G, capacitors A and B are connected by conductive strap 140, and in the embodiment of FIG. 1I, a second conductive strap 142 connects capacitors A and E (e.g., at tuning electrode 138). In the embodiment shown in FIG. 1J, a third conductive strap 144 connects capacitor A with tuning capacitor G (e.g., at tuning electrode 137). As explained herein, the tuning capacitor electrodes can have varying sizes (e.g., capacitor electrodes 132, 135, and 137 of FIGS. 1H-1J). Consequently, the overall capacitance can be customized by forming a connecting conductive feature between the main capacitor electrode (e.g., 130) and one or more of the tuning capacitor electrodes (e.g., 132, 135, 137, and/or 138). Various combinations of tuning capacitors can be connected together by the conductive feature(s) to obtain high precision capacitors with relatively small granularity, which results in high precision and/or improved matching of capacitance values.

Referring now to FIGS. 3A-3B, the conductive feature/strap 140 may also provide electrical communication between the capacitor(s) AB and an antenna/inductor 362 of a device including the tunable capacitor 300. In such embodiments, the feature/strap may be connected to the capacitor electrodes and/or the antenna/inductor using either conductive or non-conductive adhesive. Additionally, in some variations, the feature may have one or more interconnect/contact pads (not shown) for connecting to the capacitor electrodes 130/132 and/or the inductor coil 362.

In some implementations, a printed metal layer (e.g., Pd) can serve as a seed layer for electroless deposition or electroplating of other bulk conductive metals. Metal inks suitable for forming a seed layer, bulk conductive metals, and methods of forming structures from the same are described in U.S. Pat. Nos. 8,066,805 and 8,158,518 the relevant portions of which are incorporated herein by reference.

v. The Antenna and/or Inductor

As previously discussed, the capacitors of the present invention may be used in various devices. For example, in the embodiment of FIGS. 3A-3B, an antenna and/or inductor 360-363 is electrically connected to the conductive feature 140 and the conductive substrate (e.g., lower capacitor electrode) 110 to form a device 300 having capacitors in parallel. In the embodiment shown in FIGS. 5C-5D, the antenna/inductor 530-535 is electrically connected to the lower main capacitor electrode 410 and upper tuning electrode 444 to form a device with capacitors in series. Thus, in exemplary implementations, the antenna/inductor is on or over the other structures in the circuit or device. In general, the antenna and/or inductor may have any desired shape (coil, loop, zig-zag pattern, etc.) and nearly any dimensions that will fit on the device. In general, the antenna and/or inductor may comprise any conductive material discussed herein with regard to conductive structures and/or methods of forming the same.

In some implementations, the antenna/inductor further comprises one or more contact/interconnect pad regions (not shown in FIGS. 3A-3B or FIGS. 5C-5D) for connecting the inductor/antenna to the conductive substrate and/or the conductive strap. In exemplary embodiments, the contact pads comprise a metal bump or anisotropic conductive paste (ACP). The contact pads of the antenna/inductor may be attached and/or affixed to the capacitor electrodes and/or the electrically conducting strap by an adhesive, which may be either conductive or non-conductive. The contact pads may have any desired shape (e.g., round, square, rectangular, triangular, etc.), and nearly any dimensions that allow them to fit in and/or on the device, and provide electrical communication and/or physical contact with the conductive feature and the conductive substrate. The antenna/inductor may comprise a continuous structure or it may be discontinuous and comprise a first (outer) inductor coupled to one capacitor electrode and a second (inner) inductor coupled to a second capacitor electrode. In various embodiments, a backing and/or support layer may be attached to the inductor. The support and/or backing layer may provide an adhesive surface for attachment to or placement of the device (e.g., surveillance/identification device) to an item to be tracked or monitored.

In some embodiments, the inductor/antenna comprises a coil having a plurality of loops, rings, or coils. In some exemplary embodiments, the antenna/inductor has a coil or concentric spiral loop form. The concentric loops or rings of the antenna/inductor coil may have any suitable width and pitch (i.e., inter-ring spacing), and the width and/or pitch may vary from loop to loop or ring to ring (see, e.g., FIG. 3B). Suitable sizes and shapes (e.g., width, thickness, pitch, etc.) for the loops or rings of the antenna/inductor coil are discussed in detail in co-pending U.S. patent application Ser. No. 12/467,121, filed on May 15, 2009, the relevant portions of which are incorporated herein by reference.

As with the capacitor electrode(s) and the strap, a printed metal layer (e.g., Pd) can serve as a seed layer for electroless deposition or electroplating of other bulk conductive metals for the antenna. Metal inks suitable for forming a seed layer, bulk conductive metals, and methods of forming structures from the same are described in U.S. Pat. Nos. 8,066,805 and 8,158,518, the relevant portions of which are incorporated herein by reference.

vi. The Passivation Layer

Although not shown in the figures, in some embodiments, the devices of the present invention may further comprise a passivation layer on or over the structure. The passivation layer is generally conventional, and may comprise an organic polymer, or an inorganic dielectric, which may be conventionally doped and/or which may comprise a spin-on-glass, silicon nitride, silicon oxynitride, polysiloxane, or a combination thereof, as a mixture or a multilayer structure. In some variations, the passivation layer may include an underlying dielectric layer, which may comprise a material having lower stress than the overlying passivation layer. In exemplary embodiments, the passivation layer generally has the same width and length dimensions as the device. It may also have any thickness suitable for such a device. For example, the passivation layer may have a thickness of from 0.5 to 100 μm, from 3 to 50 μm, 10 to 25 μm, or any range of values therein. A detailed description of passivation layers and exemplary characteristics thereof are described in detail in co-pending U.S. patent application Ser. Nos. 12/249,735 and 12/467,121, respectively filed on Oct. 10, 2008 and May 15, 2009, the relevant portions of which are incorporated herein by reference.

The present device may also further comprise a support and/or backing layer on a surface of the inductor. The support and/or backing layers are conventional, and are well known in the surveillance/identification device arts (see, e.g., U.S. Pat. Nos. 5,841,350, 5,608,379 and 4,063,229, and U.S. Patent Application Publication No. 2002/0163434, the relevant portions of each of which are incorporated herein by reference). Generally, support and/or backing layers provide an adhesive surface for subsequent attachment or placement onto an article to be tracked or monitored, and/or mechanical support for the surveillance/identification device itself Exemplary Methods of Detecting Items Using the Present Devices The present invention further relates to method of detecting an item or object in a detection zone comprising the steps of: (a) causing or inducing a current in the device(s) of the present invention sufficient for the device to radiate, reflect, backscatter, or absorb detectable electromagnetic radiation (preferably at a frequency that is an integer multiple or an integer divisor of an applied electromagnetic field), (b) detecting the detectable electromagnetic radiation, and optionally, (c) selectively deactivating the device and/or causing the device to take action. Generally, currents and voltages are induced in the present device sufficient for the device to radiate, reflect, backscatter, or absorb detectable electromagnetic radiation when the device is in a detection zone comprising an oscillating electromagnetic field. This oscillating electromagnetic field is produced or generated by conventional surveillance/identification detection equipment and/or systems.

The present method of use may further comprise attaching, affixing or otherwise including the present device on or in an object or article to be detected. Furthermore, in accordance with an advantage of the present device, the device (e.g., tag) may be deactivated by non-volatile shifting of the thresholds (i.e., position of the CV curve features versus voltage) or capacitance of the device in response to an applied electromagnetic field having sufficient strength and an effective oscillating frequency to induce a current, voltage and/or resonance in the device. Typically, the device is deactivated when the presence of the object or article in the detection zone is not to be detected or otherwise known.

Use of electronic and/or wireless identification and security systems for detecting and/or preventing theft or unauthorized removal of articles or goods from retail establishments and/or other facilities (e.g., libraries, etc.) has become widespread. In general, surveillance/identification device systems employ a label or security tag/device (e.g., an EAS, RF, RFID, etc.), which is affixed to, placed inside, associated with, or otherwise secured to an article or item to be detected (e.g., protected) or the packaging of the item. Surveillance/identification tags may have many different sizes, shapes and forms, depending on the particular type of system in use, the type and size of the article, etc. In general, such systems are employed for detecting the presence or absence of an active security tag as the security tag and the protected article to which it is affixed (or placed inside) pass through a security or surveillance zone or pass by or near a security checkpoint or surveillance station. However, the present invention is not limited to security. For example, the present surveillance/identification devices may further comprise logic, which causes the device to perform an action upon detection in the detection zone.

The present devices are designed at least in part to work with electronic security systems that sense disturbances in radio frequency (RF) electromagnetic fields. Such electronic security systems generally establish an electromagnetic field in a controlled area defined by portals through which articles must pass in leaving the controlled premises (e.g., a retail store). A device having a resonant circuit is attached to each article, and the presence of the tag circuit in the controlled area is sensed by a receiving system to denote the unauthorized removal of an article. The tag circuit may be deactivated, detuned or removed by authorized personnel from any article authorized to leave the premises to permit passage of the article through the controlled area equipped with alarm activation. Most of the tags that operate on this principle are single-use or disposable tags, and are thus designed to be produced at low cost in very large volumes.

The present devices may be used (and, if desired and/or applicable, re-used) in any commercial application and in essentially any frequency range for such applications. For example, the present devices may be used at the frequencies, and in the fields and/or ranges, described in the Table below:

TABLE 1

Exemplary Applications.

| Frequencies | Preferred Frequencies | Preferred Range/Field of Detection/ Response | Range/Field of Detection/ Response | Exemplary Commercial Application(s) |
| --- | --- | --- | --- | --- |
| 100-150 KHz | 125-134 KHz | up to 10 feet | up to 5 feet | animal ID, car anti-theft systems, beer keg tracking |
| about 8.2 MHz | 8.2 MHz | up to 10 feet | up to 5 feet | anti-theft, inventory tracking (e.g., libraries, apparel, auto/motorcycle parts), building security/access |
| about 13.56 MHz | 13.56 MHz | up to 10 feet | up to 5 feet | inventory tracking (e.g., libraries, apparel, auto/motorcycle parts), building security/access |
| 800-1000 MHz | 868-928 MHz | up to 30 feet | up to 18 feet | pallet/shipping container tracking, shipyard container tracking |
| 2.4-2.5 GHz | about 2.45 GHz | up to 30 feet | up to 20 feet | auto toll tags |

Deactivation methods generally incorporate remote electronic deactivation of a resonant tag circuit such that the deactivated tag can remain on an article properly leaving the premises. Examples of such deactivation systems are described in U.S. Pat. Nos. 4,728,938 and 5,081,445, the relevant portions of each of which are incorporated herein by reference.

Electronic deactivation of a resonant security/identification tag involves changing or destroying the detection frequency resonance so that the security tag is no longer detected as an active security tag by the security system. There are many methods available for achieving electronic deactivation. In general, however, the known methods involve either short circuiting a portion of the resonant circuit or creating an open circuit within some portion of the resonant circuit to either spoil the Q of the circuit or shift the resonant frequency out of the frequency range of the detection system, or both.

At energy levels that are typically higher than the detecting signal, but generally within FCC regulations, the deactivation apparatus induces a voltage in the resonant circuit of the tag or device sufficient to cause the dielectric film between the lower capacitor electrode and the upper capacitor electrode to break down. Thus, the present surveillance/identification device(s) described herein can be conveniently deactivated at a checkout counter or other similar location by momentarily placing the tag above or near the deactivation apparatus.

The present invention thus also pertains to article surveillance techniques wherein electromagnetic waves are transmitted into an area of the premises being protected at a fundamental frequency (e.g., 13.56 MHz), and the unauthorized presence of articles in the area is sensed by reception and detection of electromagnetic radiation emitted or absorbed by the present surveillance/identification device(s). This emitted or absorbed electromagnetic radiation may comprise second harmonic or subsequent harmonic frequency waves reradiated from sensor-emitter elements, labels, or films comprising the present wireless surveillance device that has been attached to or embedded in the articles, under circumstances in which the labels or films have not been deactivated for authorized removal from the premises.

A method of article surveillance, theft detection, or other methods of identification according to aspects of the present invention may be understood with the following description of the sequential steps utilized. The present device (for example, formed integrally with a price label) is attached to or embedded in an item, article or object that may be under system surveillance. Next, any active tags/devices on articles that have been paid for or otherwise authorized for removal from the surveillance area may be deactivated or desensitized by a deactivation apparatus operator (e.g., a checkout clerk or guard) monitoring the premises. Thereafter, harmonic frequency emissions or re-radiation signals or electromagnetic waves or energy from devices/tags that have not been deactivated or desensitized are detected as they are moved through a detection zone (e.g., an exit or verification area) in which a fundamental frequency electromagnetic wave or electrical space energy field is present. The detection of harmonic signals in this area signifies the unauthorized presence or attempted removal of unverified articles with active devices/tags thereon, and may be used to signal or trigger an alarm or to lock exit doors or turnstiles. While the detection of tag signals at a frequency of 2 times or ½ the carrier or reader transmit frequency represents a preferred form of the method of use, other harmonic signals, such as third and subsequent harmonic signals, as well as fundamental and other subharmonic signals, may be employed.

Conclusion/Summary

Thus, embodiments of the present invention provide tunable capacitors, methods for manufacturing and/or producing tunable capacitors, devices (e.g., surveillance and/or identification tags) using tunable capacitors, and methods of making and using such devices. According to aspects of the present invention, a plurality of secondary (tuning) capacitors can be connected to a primary capacitor in parallel or in series by printing or otherwise depositing a connector conducting feature (strap) to obtain a desired total capacitance. In the present invention, one or more tunable capacitors can be fabricated as part of a printed integrated circuit fabrication process. By printing (e.g., digitally printing) the connector conductive feature/strap, the number of secondary capacitors connected into the circuit can be determined or selected during the integrated circuit fabrication process without the need for individual masks connecting the appropriate number of tuning capacitors. This effectively provides an in-process or post-process trimming method to obtain a desired precision and accuracy for capacitors. The capacitors of the present invention may be further customized by forming tuning capacitors with varying sizes and/or shapes. Having tuning capacitors of varying size enables various combinations to be connected together to obtain high precision capacitors with relatively small granularity, resulting in high precision and/or improved matching of capacitance values.

The main capacitor and tuning capacitors may be connected in parallel to increase the overall capacitance of the device, or alternatively the capacitors may be connected in series to decrease the overall capacitance of the device. The capacitors of the present invention may be used to make devices (e.g., wireless, surveillance/identifications tags, EAS, RF, RFID, HF, VHF, and/or UHF, etc.). Additionally, the methods and techniques described herein may also be used to connect other devices (e.g., transistors and/or resistors) in parallel or in series for analog tuning purpose, such as resistor tuning or transistors with tuning The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of forming a capacitor, comprising:
  a) depositing a main capacitor dielectric layer on a conductive substrate;
  b) forming a main upper electrode and a plurality of tuning electrodes on said main capacitor dielectric layer, wherein forming the main upper electrode and the tuning electrodes comprises printing a metal precursor ink on the main capacitor dielectric layer in a pattern corresponding to the main upper electrode; and
  c) printing one or more conductive features electrically connecting said main upper electrode to at least one of said tuning electrodes.

2. The method of claim 1, wherein said conductive substrate comprises a main lower electrode.

3. The method of claim 1, wherein the conductive substrate comprises a metal sheet comprising aluminum, titanium, copper, silver, chromium, molybdenum, tungsten, nickel, gold, palladium, platinum, zinc, iron, or an alloy thereof.

4. The method of claim 1, wherein the conductive substrate comprises a metal foil comprising aluminum, copper, or stainless steel.

5. The method of claim 1, further comprising cleaning or smoothing the conductive substrate before depositing the main capacitor dielectric layer thereon.

6. The method of claim 1, wherein printing the one or more conductive features comprises printing a conductive seed layer and electroplating or electrolessly plating a bulk conductor on the conductive seed layer.

7. The method of claim 1, wherein printing the one or more conductive features comprises digitally printing a metal precursor material in a desired pattern.

8. The method of claim 1, wherein the one or more conductive features comprise a conductive metal, a nitride, or a metal alloy.

9. The method of claim 1, further comprising forming a passivation layer on the substrate by coating an upper surface of the substrate with one or more inorganic barrier layers and/or one or more organic barrier layers.

10. A method of making a device comprising:
a) forming a capacitor by (i) depositing a main capacitor dielectric layer on a conductive substrate, (ii) forming a main upper electrode and a plurality of tuning electrodes on said main capacitor dielectric layer, and (iii) printing one or more conductive features electrically connecting said main upper electrode to at least one of said tuning electrodes;
b) forming a second dielectric layer on at least part of the substrate; and
c) forming an antenna and/or inductor electrically connected to said conducting feature and said conductive substrate.

11. The method of claim 10, wherein forming said main upper electrode comprises selectively depositing a conducting layer on said main capacitor dielectric layer.

12. The method of claim 11, wherein depositing said conducting layer comprises printing a metal precursor ink in a pattern corresponding to said main upper electrode.

13. The method of claim 12, further comprising drying said metal precursor ink and annealing said dried precursor to form said conducting layer.

14. The method of claim 12, wherein printing the metal precursor ink comprises inkjet printing, gravure printing, screen printing, offset printing, flexography, laser writing, laser forward transfer, or local laser chemical vapor deposition.

15. The method of claim 12, wherein the metal precursor ink comprises nanoparticles, salts, clusters, complexes, compounds, nitrides, and/or silicides of an elemental metal or metal alloy.

16. The method of claim 12, further comprising etching the dielectric layer before printing the metal precursor ink.

17. The method of claim 10, wherein forming the main upper electrode and the plurality of tuning electrodes comprises printing a metal seed layer on the main capacitor dielectric layer and depositing a bulk metal on the seed layer by electroplating or electroless plating.

18. The method of claim 10, wherein forming the main upper electrode and the plurality of tuning electrodes comprises depositing one or more semiconductor compounds on the main capacitor dielectric layer and recrystallizing the semiconductor material.

19. The method of claim 18, wherein the semiconductor material is lightly or heavily doped.

20. The method of claim 10, wherein depositing the main capacitor dielectric layer comprises selectively printing a liquid-phase dielectric precursor material on the conductive substrate to form a pattern, and the method further comprises drying and/or curing the dielectric precursor.

21. The method of claim 10, wherein depositing the main capacitor dielectric layer comprises covering the entire conductive substrate with a dielectric precursor ink and curing to form the dielectric layer, and the method further comprises etching the dielectric layer to form a pattern using subsequently formed structures as a mask.

22. The method of claim 10, wherein forming the second dielectric layer comprises selectively printing a dielectric material in a pattern including contact holes therein, the contact holes exposing at least a portion of the one or more conductive features and/or the conductive substrate.

23. The method of claim 10, wherein forming the antenna and/or inductor comprises selectively printing a metal precursor ink on the second dielectric layer in a pattern corresponding to the antenna and/or inductor.

24. A method of forming a capacitor, comprising:
a) depositing a main capacitor dielectric layer on a conductive substrate;
b) forming a main upper electrode and a plurality of tuning electrodes on said main capacitor dielectric layer, wherein forming the main upper electrode and the plurality of tuning electrodes comprises printing a metal seed layer on the main capacitor dielectric layer and depositing a bulk metal on the seed layer by electroplating or electroless plating; and
c) printing one or more conductive features electrically connecting said main upper electrode to at least one of said tuning electrodes.

25. A method of forming a capacitor, comprising:
a) depositing a main capacitor dielectric layer on a conductive substrate;
b) forming a main upper electrode and a plurality of tuning electrodes on said main capacitor dielectric layer, wherein forming the main upper electrode and the plurality of tuning electrodes comprises depositing one or more semiconductor compounds on the main capacitor dielectric layer and recrystallizing the semiconductor material; and
c) printing one or more conductive features electrically connecting said main upper electrode to at least one of said tuning electrodes.

26. A method of forming a capacitor, comprising:
a) depositing a main capacitor dielectric layer on a conductive substrate, wherein depositing the main capacitor dielectric layer comprises selectively printing a liquid-phase dielectric precursor material on the conductive substrate to form a pattern, and the method further comprises drying and/or curing the dielectric precursor;
b) forming a main upper electrode and a plurality of tuning electrodes on said main capacitor dielectric layer; and
c) printing one or more conductive features electrically connecting said main upper electrode to at least one of said tuning electrodes.

27. A method of forming a capacitor, comprising:
a) depositing a main capacitor dielectric layer on a conductive substrate, wherein depositing the main capacitor dielectric layer comprises covering the entire conductive substrate with a dielectric precursor ink and curing to form the dielectric layer, and the method further comprises etching the dielectric layer to form a pattern using subsequently formed structures as a mask;
b) forming a main upper electrode and a plurality of tuning electrodes on said main capacitor dielectric layer; and
c) printing one or more conductive features electrically connecting said main upper electrode to at least one of said tuning electrodes.

28. A method of forming a capacitor, comprising:
a) depositing a main capacitor dielectric layer on a conductive substrate;
b) forming a main upper electrode and a plurality of tuning electrodes on said main capacitor dielectric layer; and
c) printing one or more conductive features electrically connecting said main upper electrode to at least one of said tuning electrodes, wherein printing the one or more conductive features comprises printing a conductive seed layer and electroplating or electrolessly plating a bulk conductor on the conductive seed layer.

* * * * *